United States Patent
Maejima et al.

(10) Patent No.: US 7,920,421 B2
(45) Date of Patent: Apr. 5, 2011

(54) SEMICONDUCTOR MEMORY DEVICE PROVIDED WITH MEMORY CELLS HAVING CHARGE STORAGE LAYER AND CONTROL GATE

(75) Inventors: Hiroshi Maejima, Chigasaki (JP); Hiroshi Nakamura, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 69 days.

(21) Appl. No.: 12/342,952

(22) Filed: Dec. 23, 2008

(65) Prior Publication Data
US 2009/0168514 A1   Jul. 2, 2009

(30) Foreign Application Priority Data

Dec. 28, 2007  (JP) ................................. 2007-339947

(51) Int. Cl.
G11C 16/00  (2006.01)
G11C 16/06  (2006.01)

(52) U.S. Cl. .......... 365/185.03; 365/185.18; 365/185.21

(58) Field of Classification Search .................. None
See application file for complete search history.

(56) References Cited

U.S. PATENT DOCUMENTS

| 5,654,920 A * | 8/1997 | Watsuji et al. ........... 365/185.27 |
| 5,889,702 A * | 3/1999 | Gaultier et al. ............ 365/185.2 |
| 2002/0027233 A1 * | 3/2002 | Yamaki et al. ................ 257/200 |
| 2002/0139999 A1 * | 10/2002 | Hirano .......................... 257/200 |
| 2008/0094903 A1 | 4/2008 | Maejima et al. |

FOREIGN PATENT DOCUMENTS

JP    2006-107709    4/2006

* cited by examiner

*Primary Examiner* — Hoai V Ho
*Assistant Examiner* — James G Norman
(74) *Attorney, Agent, or Firm* — Oblon, Spivak, McClelland, Maier & Neustadt, L.L.P.

(57) ABSTRACT

A semiconductor memory device includes a memory cell, a source line, and a source line control circuit. The memory cell includes a charge storage layer and a control gate and is capable of holding 2 levels or more levels of data. The source line is electrically connected to a source of the memory cell. The source line control circuit detects a current passed to the source line and controls a potential of the source line in accordance with a detected current amount in a reading operation or a verification operation of the data.

17 Claims, 21 Drawing Sheets

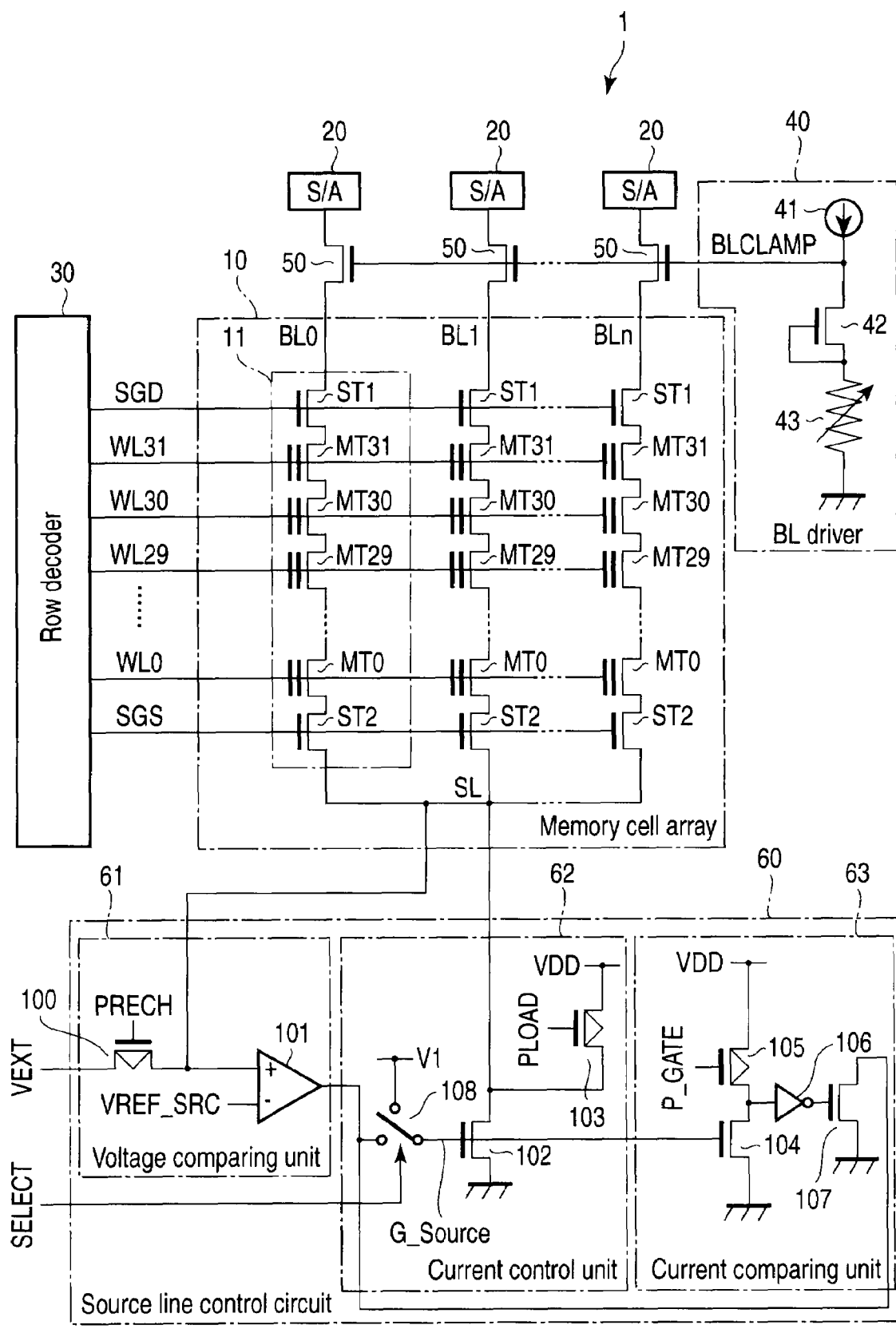
F I G. 1

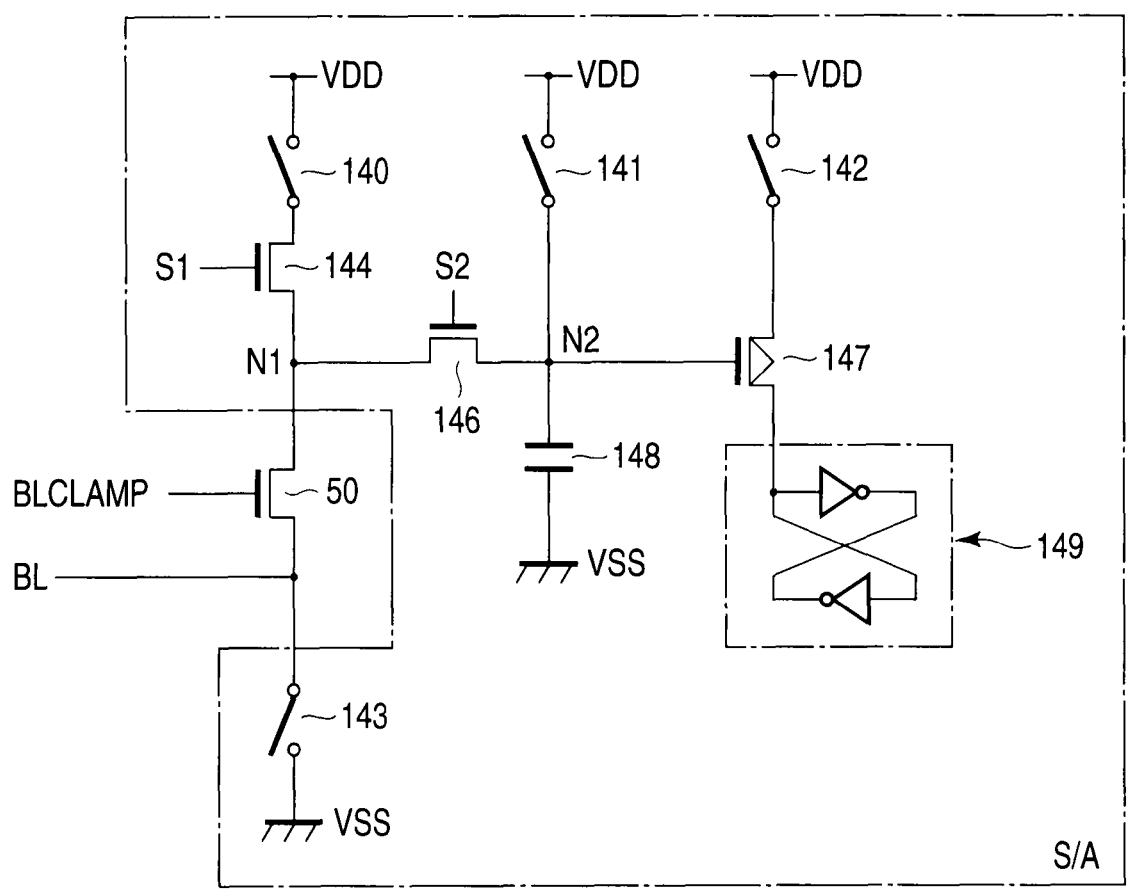
F I G. 4

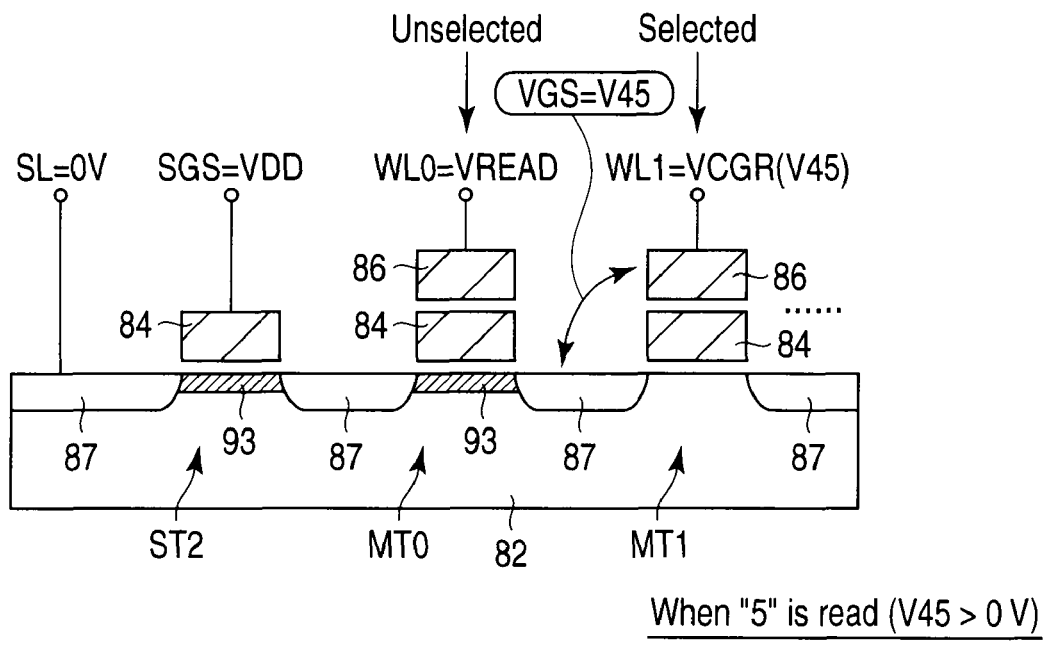
F I G. 6
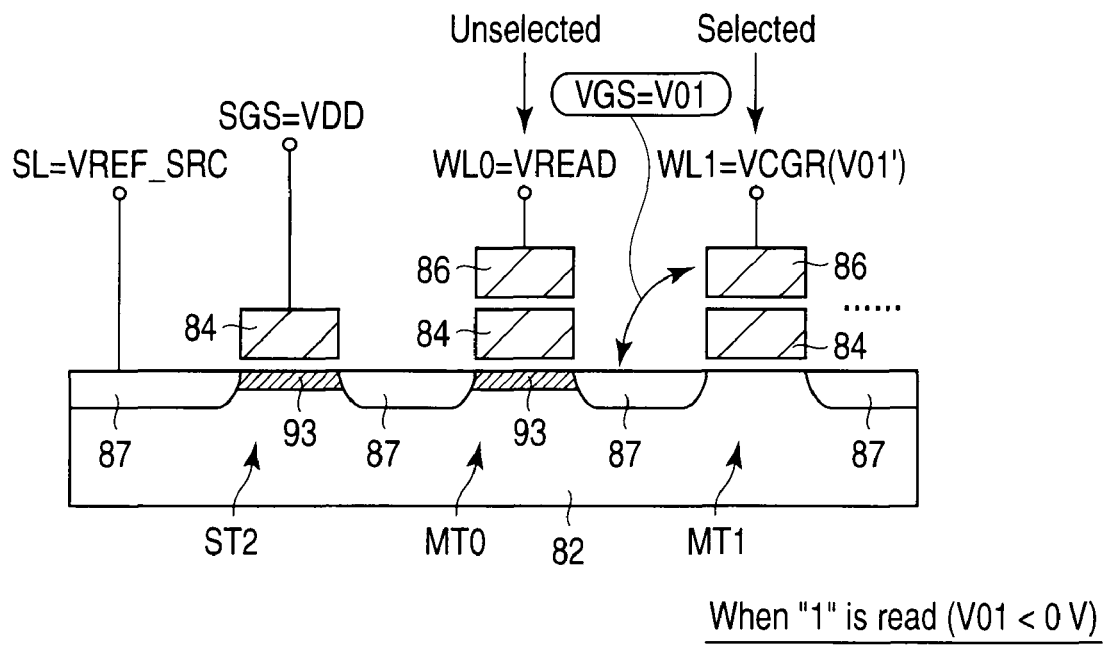
F I G. 7

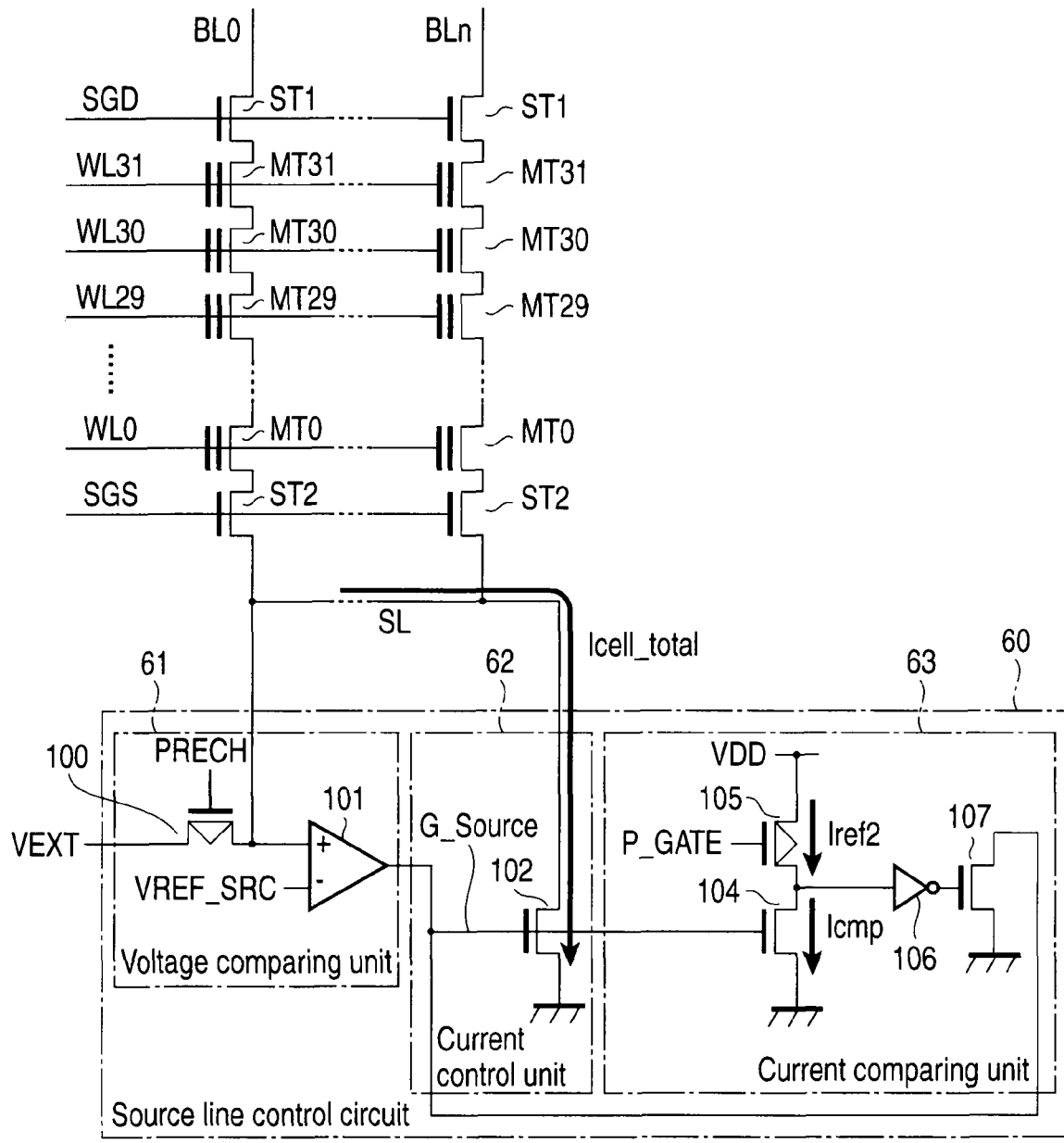
F I G. 13

Read level is equal to zero or more

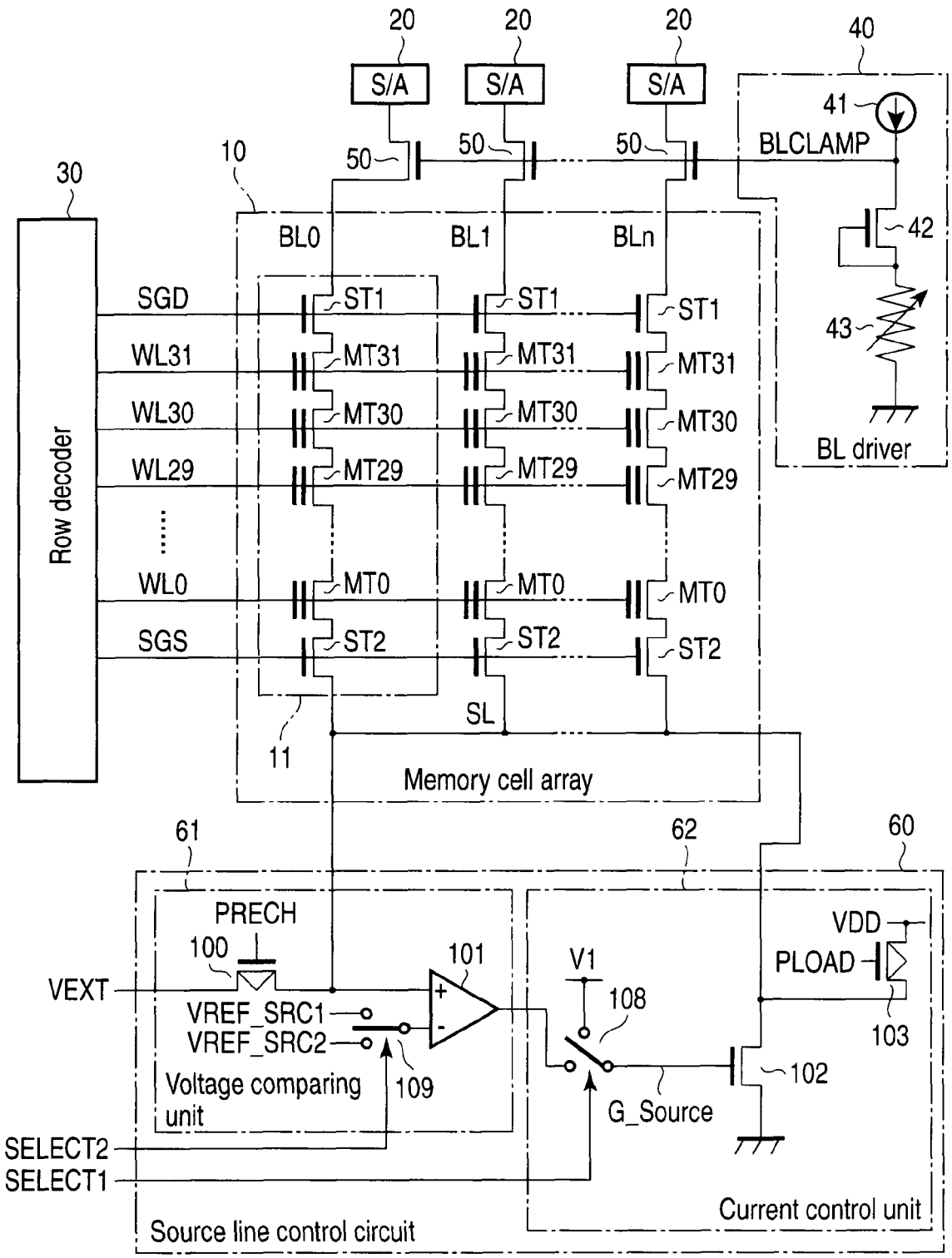
F I G. 20

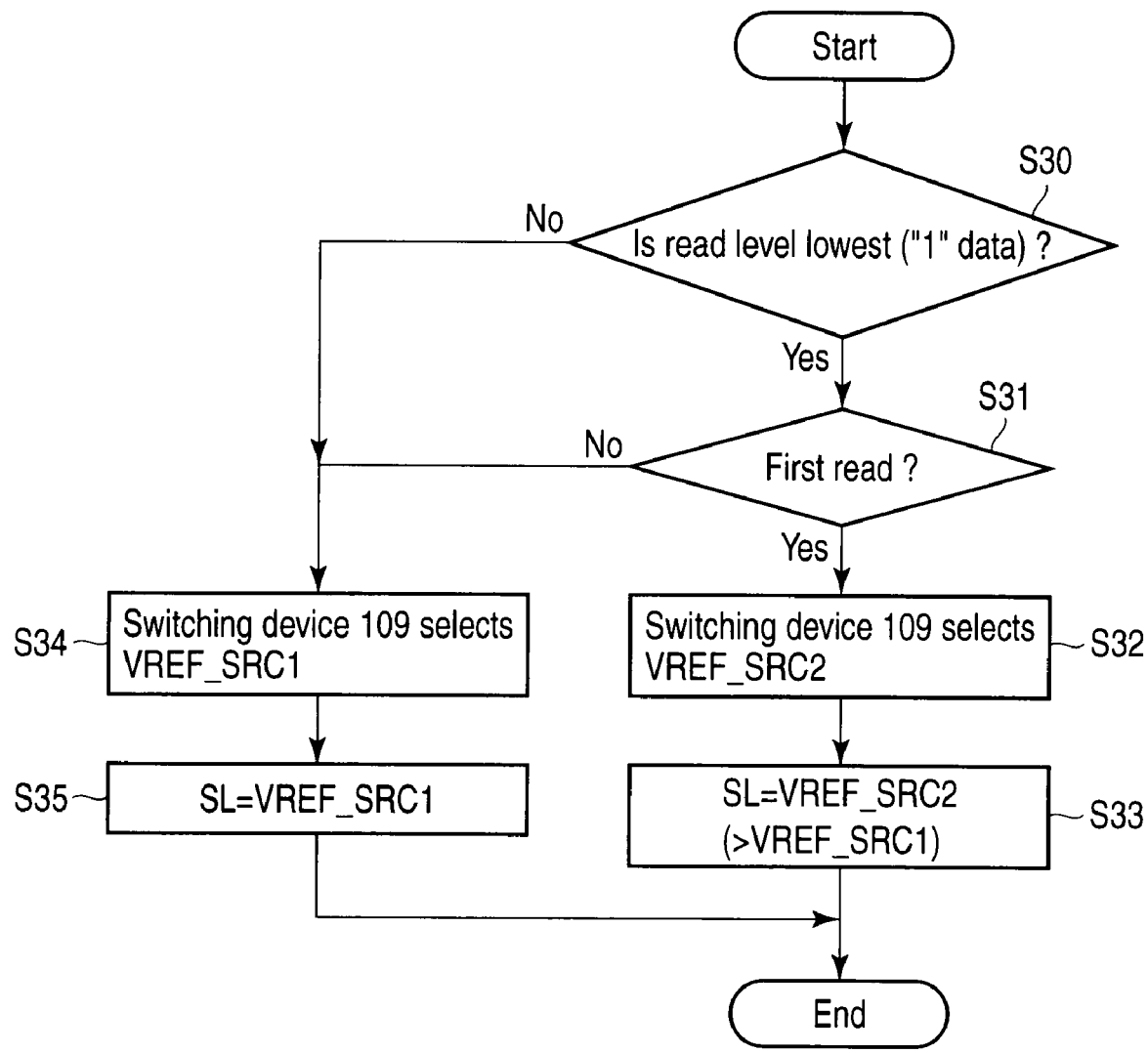
F I G. 21

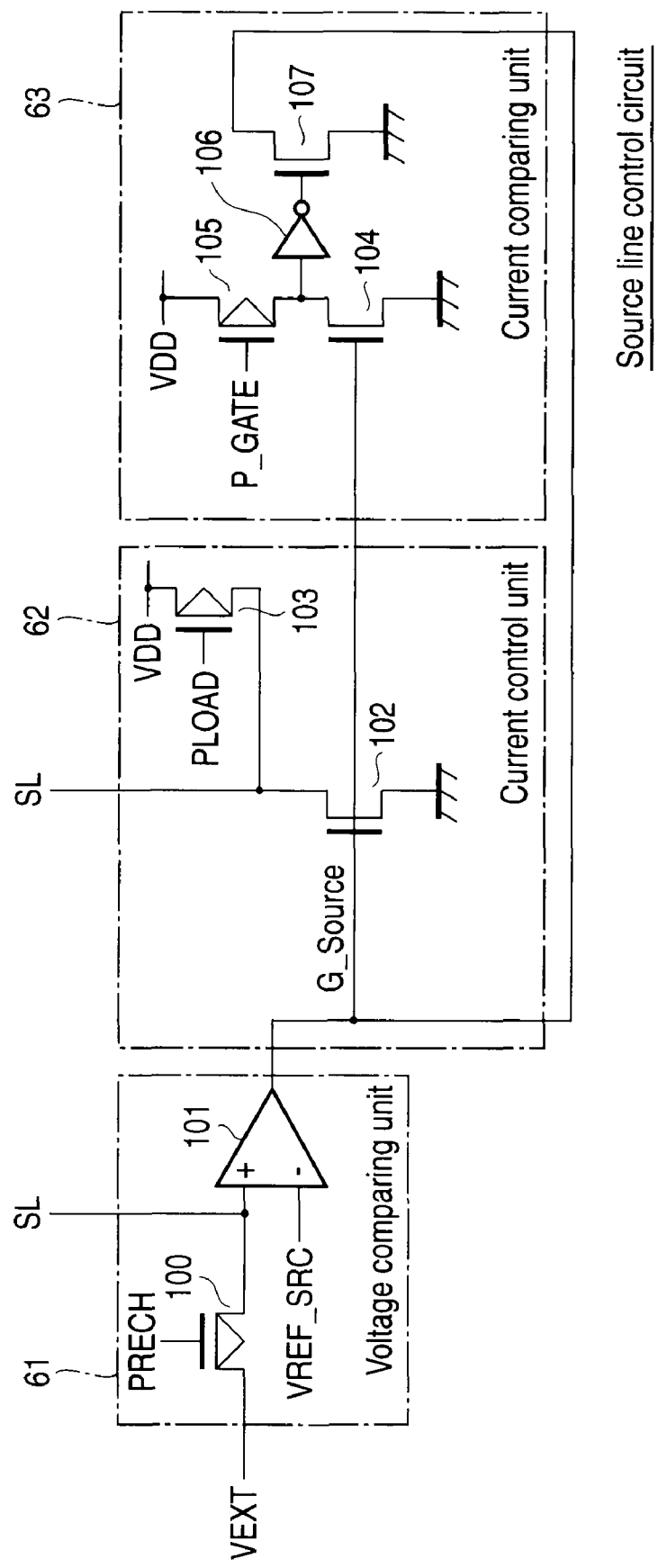
F I G. 23

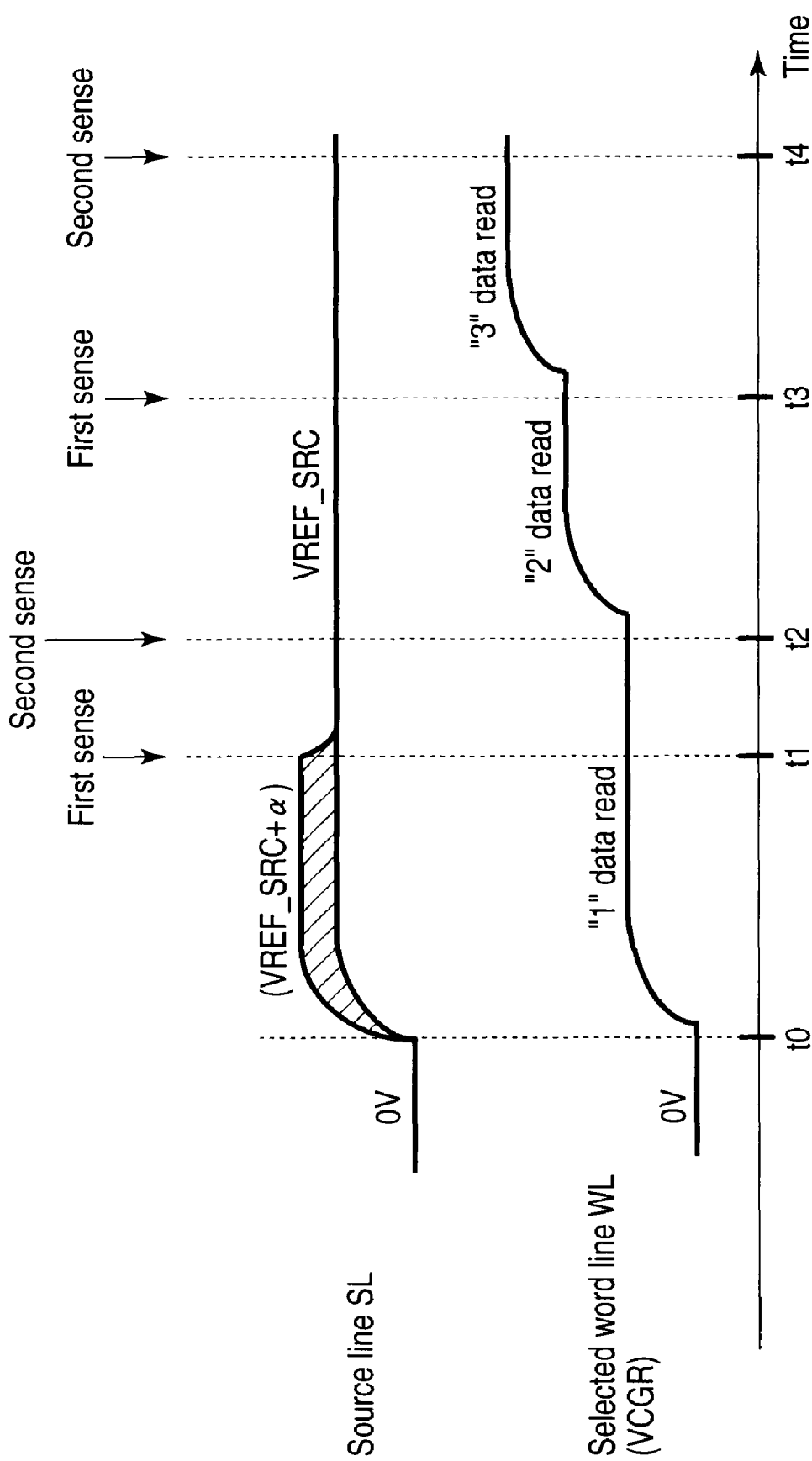
F I G. 24

US 7,920,421 B2

SEMICONDUCTOR MEMORY DEVICE PROVIDED WITH MEMORY CELLS HAVING CHARGE STORAGE LAYER AND CONTROL GATE

CROSS-REFERENCE TO RELATED APPLICATIONS

This application is based upon and claims the benefit of priority from prior Japanese Patent Application No. 2007-339947, filed Dec. 28, 2007, the entire contents of which are incorporated herein by reference.

BACKGROUND OF THE INVENTION

1. Field of the Invention

The present invention relates to a semiconductor memory device and, for example, relates to a reading operation of a NAND-type flash memory.

2. Description of the Related Art

A NAND-type flash memory has been known as a non-volatile semiconductor memory. In the NAND-type flash memory, a method of sensing a current is known as a method of reading data. Such a technique is disclosed, for example, by Jpn. Pat. Appln. KOKAI Publication No. 2006-107709.

According to the technique, an influence of noise between bit lines is reduced by maintaining the potential of bit lines constant. However, in order to maintain the potential of bit lines constant, it is necessary to continue to flow a cell current from bit lines to source lines. Then, if the size of one page is, for example, several Kbytes, the total of cell currents will be a very large value of about 100 mA. Thus, there is a possibility that the total of cell currents exceeds current specific permitted for one chip, leading to lower reliability as a product.

BRIEF SUMMARY OF THE INVENTION

A semiconductor memory device according to an aspect of the present invention includes:
a memory cell including a charge storage layer and a control gate and capable of holding 2 levels or more levels of data;
a source line electrically connected to a source of the memory cell; and a source line control circuit which detects a current passed to the source line and controls a potential of the source line in accordance with a detected current amount in a reading operation or a verification operation of the data.

BRIEF DESCRIPTION OF THE SEVERAL VIEWS OF THE DRAWING

FIG. 1 is a block diagram of a flash memory according to a first embodiment of the present invention;

FIG. 4 is a circuit diagram of a sense amplifier according to the first embodiment;

FIG. 6 and FIG. 7 are sectional views of a partial region of the memory cell unit according to the first embodiment;

FIG. 13 is a circuit diagram of the memory cell array and source line control circuit according to the first embodiment;

FIG. 20 is a block diagram of a flash memory according to a second embodiment of the present invention;

FIG. 21 is a flow chart showing the operation of a source line control circuit according to the second embodiment;

FIG. 23 is a circuit diagram of a source line control circuit according to a third embodiment;

FIG. 24 is a timing chart of various voltages during reading operations of a flash memory according to the third embodiment;

DETAILED DESCRIPTION OF THE INVENTION

First Embodiment

Figure 2:
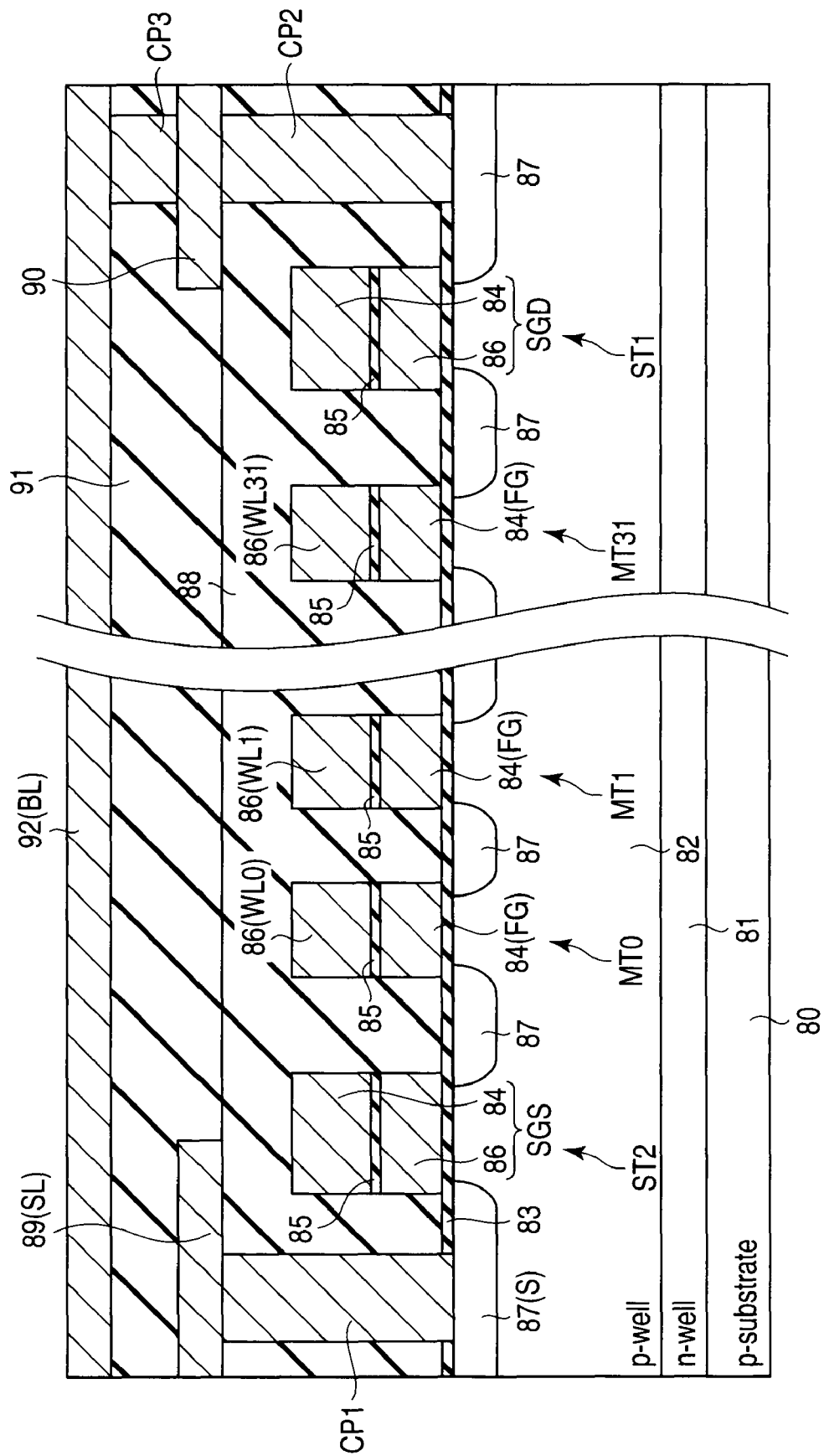
FIG. 2 is a sectional view of a memory cell array according to the first embodiment.

A semiconductor memory device according to a first embodiment of the present invention will be described by taking a NAND-type flash memory as an example.

<Configuration of a NAND-type Flash Memory>

FIG. 1 is a block diagram of a NAND-type flash memory according to the first embodiment of the present invention. As illustrated in FIG. 1, a NAND-type flash memory 1 includes a memory cell array 10, a sense amplifier 20, a row decoder 30, a bit line driver 40, a MOS transistor 50, and a source line control circuit 60.

First, the memory cell array 10 will be described. The memory cell array 10 has a plurality of memory cell units 11. Each of the memory cell units 11 includes, for example, 32 memory cell transistors MT0 to MT31 and selection transistors ST1 and ST2. When each of the memory cell transistors MT0 to MT31 is not distinguished below, the memory cell transistors MT0 to MT31 are collectively called memory cell transistors MT. The memory cell transistor MT has a stacked gate structure having a charge storage layer (for example, a floating gate) formed on a semiconductor substrate with a gate insulating film interposed therebetween and a control gate electrode formed on the charge storage layer with an inter-gate insulating film interposed therebetween. The number of memory cell transistors MT is not limited to 32 and may be 8, 16, 64, 128, or 256, which is not limited to a specific number. Adjacent memory cell transistors MT share a source or a drain. The memory cell transistors MT are arranged between the selection transistors ST1 and ST2 in such a manner that current paths thereof are connected in series. The drain at one end of the memory cell transistor MT connected in series is connected to the source of the selection transistor ST1 and the source at the other end of the memory cell transistor MT connected in series is connected to the drain of the selection transistor ST2.

Control gate electrodes of the memory cell transistors MT in the same row are connected to one of word lines WL0 to WL31 in common and gates of the selection transistors ST1 and ST2 of memory cells in the same row are connected to select gate lines SGD and SGS in common respectively. For simplification of description, the word lines WL0 to WL31 may be simply called word lines WL below. Also in the memory cell array 10, drains of the selection transistors ST1 in the same column are connected to bit lines BL0 to BLm in common (m is a natural number). The bit lines BL0 to BLm may also be simply called bit lines BL. Sources of the selection transistors ST2 are connected to the source line SL in common. Incidentally, both the selection transistors ST1 and ST2 are not necessarily needed and, if the memory cell unit 11 can be selected, only one of the selection transistors ST1 and ST2 may be provided.

FIG. 1 illustrates only one row of the memory cell unit 11. However, a plurality of rows of the memory cell units 11 may be provided in the memory cell array 10. In such a case, the memory cell units 11 in the same column are connected to the same bit line BL. Data is collectively written to a plurality of memory cell transistors MT connected to the same word line WL and this unit is called a page. Further, data is collectively erased from a plurality of the memory cell units 11 in the same row and this unit is called a memory block.

Next, the configuration of the memory cell unit 11 provided with the memory cell array 10 will be described using FIG. 2. FIG. 2 is a sectional view along the bit line direction of the memory cell unit 11.

As illustrated in FIG. 2, an n-type well region 81 is formed in a surface area of a p-type semiconductor substrate 80 and a p-type well region 82 is formed in the surface area of the n-type well region 81. A gate insulating film 83 is formed on the p-type well region 82 and gate electrodes of the memory cell transistors MT and the selection transistors ST1 and ST2 are formed on the gate insulating film 83. The gate electrode of the memory cell transistors MT and the selection transistors ST1 and ST2 has a polycrystalline silicon layer 84 formed on the gate insulating film 83, an inter-gate insulating film 85 formed on the polycrystalline silicon layer 84, and a polycrystalline silicon layer 86 formed on the inter-gate insulating film 85. The inter-gate insulating film 85 is formed, for example, from a silicon oxide film, an ON film, NO film, or ONO film, which are stacked structures of a silicon oxide film and silicon nitride film, a laminated structure including these films, or a laminated structure of $TiO_2$, $HfO_2$, $Al_2O_3$, $HfAlO_x$, and HfAlSi films and a silicon oxide film or silicon nitride film. The gate insulating film 83 functions also as a tunnel insulating film.

In the memory cell transistor MT, the polycrystalline silicon layer 84 functions as a floating gate (FG). On the other hand, the polycrystalline silicon layers 86 adjacent to each other in a direction perpendicular to the bit line are connected in common and function as control gate electrodes (word line WL). In the selection transistors ST1 and ST2, the polycrystalline silicon layers 84 and 86 adjacent to each other in a word line direction are connected in common. The polycrystalline silicon layers 84 and 86 function as the select gate lines SGS and SGD. Incidentally, only the polycrystalline silicon layer 84 may function as a select gate line. In such a case, the potential of the polycrystalline silicon layers 86 of the selection transistors ST1 and ST2 is maintained constant or in a floating state. An $n^+$-type impurity diffusion layer 87 is formed in a surface area of the semiconductor substrate 80 positioned between gate electrodes. The impurity diffusion layer 87 is shared by adjacent transistors and functions as a source (S) or drain (D). In addition, a region between adjacent source and drain functions as a channel region, which is a movement region of electrons. MOS transistors to be the memory cell transistors MT and the selection transistors ST1 and ST2 are formed from these gate electrodes, the impurity diffusion layer 87, and the channel regions.

An interlayer insulating film 88 is formed on the semiconductor substrate 80 so as to cover the memory cell transistors MT and the selection transistors ST1 and ST2. A contact plug CP1 reaching the impurity diffusion layer (source) 87 of the selection transistor ST2 on the source side is formed in the interlayer insulating film 88. Then, a metal wiring layer 89 connected to the contact plug CP1 is formed on the interlayer insulating film 88. The metal wiring layer 89 functions as a portion of the source line SL. Also, a contact plug CP2 reaching the impurity diffusion layer (drain) 87 of the selection transistor ST1 on the drain side is formed in the interlayer insulating film 88. Then, a metal wiring layer 90 connected to the contact plug CP2 is formed on the interlayer insulating film 88.

An interlayer insulating film 91 is formed on the interlayer insulating film 88 so as to cover the metal wiring layers 89 and 90. A contact plug CP3 reaching the metal wiring layer 90 is formed in the interlayer insulating film 91. Then, a metal wiring layer 92 connected to a plurality of contact plugs CP3 in common is formed on the interlayer insulating film 91. The metal wiring layer 92 functions as a bit line BL.

Figure 3:
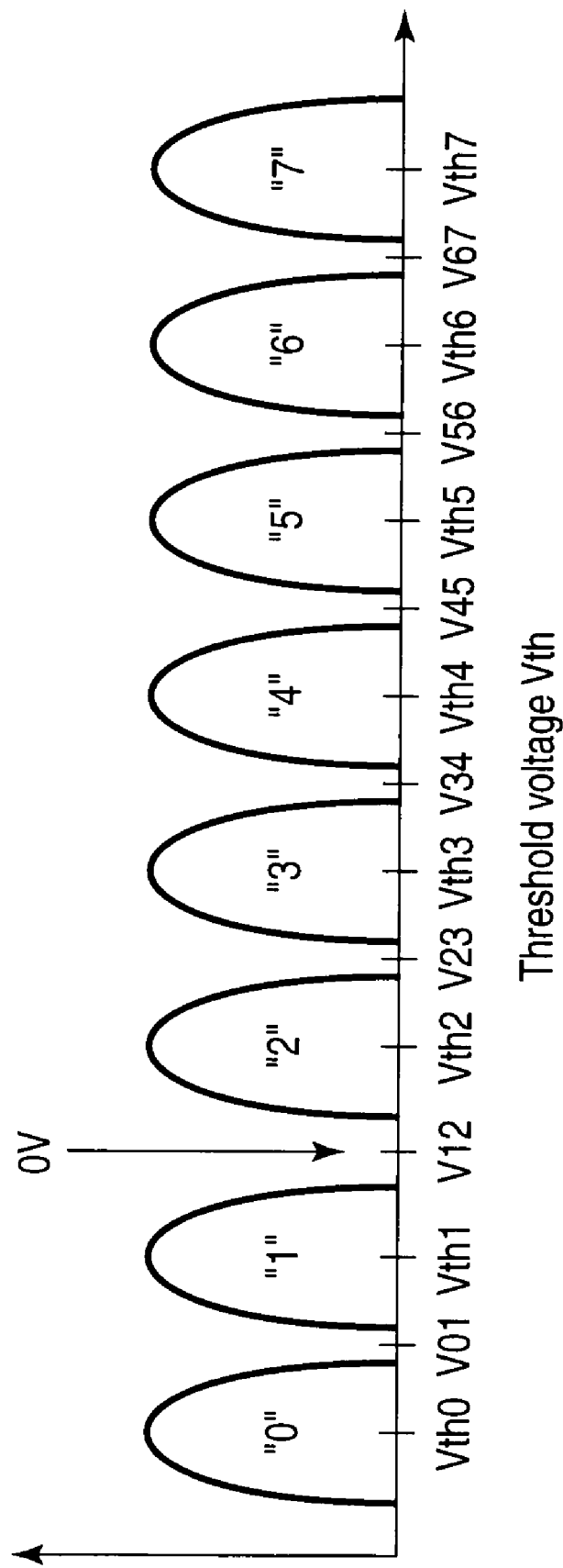
FIG. 3 is a graph showing a distribution of thresholds of memory cells according to the first embodiment.

Next, a distribution of thresholds of the memory cell transistors MT will be described using FIG. 3. FIG. 3 is a graph in which the horizontal axis shows a threshold voltage Vth and the vertical axis shows the probability of presence of the memory cell transistor MT.

As illustrated in FIG. 3, each memory cell transistor MT can hold 8-level data (3-bit data). That is, the memory cell transistor MT can hold eight kinds of data of "0", "1", "2", "3", ..., "7" in ascending order of threshold voltage Vth. The threshold voltage Vth0 of the memory cell transistor holding "0" data is Vth0<V01. The threshold voltage Vth1 of the memory cell transistor holding "1" data is V01<Vth1<V12. The threshold voltage Vth2 of the memory cell transistor holding "2" data is V12<Vth2<V23. The threshold voltage Vth3 of the memory cell transistor holding "3" data is V23<Vth3<V34. The threshold voltage Vth4 of the memory cell transistor holding "4" data is V34<Vth4<V45. The threshold voltage Vth5 of the memory cell transistor holding "5" data is V45<Vth5<V56. The threshold voltage Vth6 of the memory cell transistor holding "6" data is V56<Vth6<V67. Then, the threshold voltage Vth7 of the memory cell transistor holding "7" data is V67<Vth7.

Then, for example, the voltage V12 is 0V. That is, the threshold voltages Vth0 and Vth1 of "0" data and "1" data are negative values and the threshold voltages Vth2 to Vth7 of "2" data to "7" data are positive values. The voltage V(i-1) of "i" data (i is one of 1 to 7) will be called a "read level" of "i" data below. That is, the voltage V01 is the read level of "1" data and the voltage V12 is the read level of "2" data. Then, of "1" data to "7" data, the read level of "1" data is a negative value, the read level of "2" data is zero, and the read level of "3" data or greater is a positive value.

The read level to be 0V is not limited to V12 and the voltage V23 or V34 may be 0V with at least one read level having a negative value. Data that can be held by the memory cell transistor MT is not limited to 8-level data. For example, 2-level (1-bit data), 4-level (2-bit data), or 16-level (4-bit data) data with the read level of one piece of data is a negative value is allowed.

The description will continue by returning to FIG. 1. The row decoder 30 applies voltages to the select gate lines SGD and SGS and the word line WL in a writing operation, reading operation, or erasing operation of data. When data is written, the row decoder 30 applies a voltage to the select gate line SGD. Then, the row decoder 30 turns on the selection transistor ST1 in the memory cell unit 11 containing the memory cell transistor MT in which electrons should be injected and cuts off the other selection transistors ST1. The row decoder 30 also applies 0V to the select gate line SGS to turn off the selection transistor ST2. Further, the row decoder 30 selects one word line WL to apply a program voltage VPGM to the selected word line and a voltage VPASS to unselected word lines. The program voltage VPGM is a high voltage (for example, 20V) to inject electrons in a charge storage layer and the voltage VPASS is a voltage to turn on the memory cell transistor MT regardless of held data. When data is erased, the row decoder 30 applies 0V to all word lines WL and a positive voltage (for example, 20V) to the p-type well region 82 in which the memory cell transistor MT is formed. Electrons in the charge storage layer are thereby pulled into the well region 82 to erase data. The operation when data is read will be described later.

Each of the MOS transistors 50 connects the bit line BL and the sense amplifier 20. That is, one end of a current path of each of the MOS transistors 50 is connected to the corresponding bit line and the other end of the current path to the corresponding sense amplifier 20. A voltage BLCLAMP is provided to the gate. Then, the bit line BL and the sense amplifier 20 are electrically connected by the MOS transistor 50 being turned on.

The bit line driver 40 provides the voltage BLCLAMP to the gate of the MOS transistor 50. The MOS transistor 50 is turned on by the voltage BLCLAMP being provided by the bit line driver 40. As shown in FIG. 1, the bit line driver 40 includes a current source circuit 41, an n-channel MOS transistor 42, and a variable resistive element 43. An output node of the current source circuit 41 is connected to one end of the current path of the MOS transistor 42. The other end of the current path of the MOS transistor 42 and the gate are connected in common. That is, the MOS transistor 42 functions as a diode element. One end of the resistive element 43 is connected to the connection node of the other end of the current path of the MOS transistor 42 and the gate and the other end thereof is grounded. Then, the potential of the connection node of the current source circuit 41 and the MOS transistor 42 is provided to the gate of the MOS transistor 50 as a signal BLCLAMP.

Next, the sense amplifier 20 will be described. When data is read, each of the sense amplifiers 20 senses and amplifies data read from the memory cell transistor MT to the bit line BL. When data is written, data to be written is transferred from the memory cell transistor MT to the corresponding bit line BL. The configuration of the sense amplifier 20 will be described using FIG. 4. FIG. 4 shows a circuit diagram of the sense amplifier 20.

As illustrated in FIG. 4, the sense amplifier 20 includes switching devices 140 to 143, n-channel MOS transistors 144 and 146, a p-channel MOS transistor 147, a capacitor element 148, and a latch circuit 149. A voltage VDD is provided to one end of the current path of the MOS transistor 144 via the switching device 140, the other end is connected to a node N1, and a signal S1 is input to the gate. The node N1 is connected to the bit line BL via the current path of the MOS transistor 50.

One end of the current path of the MOS transistor 146 is connected to the node N1, the other end is connected to a node N2, and a signal S2 is input to the gate. The voltage VDD is provided to the node N2 via the switching device 141. One electrode of the capacitor element 148 is connected to the node N2 and a voltage VSS is provided to the other electrode. The voltage VDD is provided to one end of the current path of the MOS transistor 147 via the switching device 142, the other end is connected to the latch circuit 149, and the gate is connected to the node N2. The switching device 143 connects the bit line BL to the voltage VSS node in accordance with data held by the latch circuit 149.

Next, the source line control circuit 60 will be described. The source line control circuit 60 controls the potential of the source line SL and the current that is passed through the source line SL. As shown in FIG. 1, the source line control circuit 60 roughly includes a voltage comparing unit 61, a current control unit 62, and a current comparing unit 63.

The voltage comparing unit 61 compares the potential of the source line SL with a reference voltage and also provides a potential to the source line SL. As illustrated in FIG. 1, the voltage comparing unit 61 includes a p-channel MOS transistor 100 and a comparator 101.

The MOS transistor 100 has a gate to which a precharge signal PRECH is input, one end of the current path to which a voltage VEXT is provided from outside, and the other end of the current path connected to the source line SL. The signal PRECH turns on the MOS transistor 100 by the "L" level being set when the bit line is precharged in a reading operation of data. As a result, the potential of the source line SL rises.

A normal input terminal (+) of the comparator 101 is connected to the source line SL and a voltage VREF_SRC is input to an inversion input terminal (−). That is, the comparator 101 compares the potential of the source line SL and the voltage VREF_SRC and outputs the "H" level when the potential of the source line SL exceeds the voltage VREF_SRC. The voltage VREF_SRC is set to be equal to or greater than the absolute value of the read level V01 for "0" data of the lowest threshold voltage.

Next, the current control unit 62 will be described. The current control unit 62 controls the current passed through the source line SL. As illustrated in FIG. 1, the current control unit 62 includes an n-channel MOS transistor 102, a p-channel MOS transistor 103, and a switching device 108.

The drain of the MOS transistor 102 is connected to the source line SL and the source thereof is grounded. The node of the gate of the MOS transistor 102 will be called a node G_Source below. The gate width of the MOS transistor 102 will be called a gate width W1 below.

The switching device 108 connects the node G_Source to the voltage V1 node or the output node of the comparator 101 in accordance with a selection signal SELECT. More specifically, when the read level is negative, the node G_Source is connected to the output node of the comparator 101. If, on the other hand, the read level is zero or positive, the node G_Source is connected to the voltage V1 node. The voltage V1 is, for example, about 8V and is a voltage that turns on the MOS transistor 102. The selection signal SELECT is provided, for example, by a control circuit (not shown) to control an operation of the NAND-type flash memory 1.

The MOS transistor 103 has a gate to which a signal PLOAD is input, the drain connected to the source potential VDD, and the source connected to the source line SL. The signal PLOAD is set at "L" level to turn on the MOS transistor 103 after the potential of the source line SL is raised by the MOS transistor 100 in a reading operation of data. By supplying the voltage to the source line SL by the MOS transistor 103, sharp fluctuations in potential of the source line SL are suppressed.

Next, the current comparing unit 63 will be described. The current comparing unit 63 compares the current passed through the source line SL with the reference current. Then, based on a comparison result, the current comparing unit 63 controls the MOS transistor 102 in the current control unit 62. As illustrated in FIG. 1, the current comparing unit 63 includes n-channel MOS transistors 104 and 107, a p-channel MOS transistor 105, and an inverter 106.

The gate of the MOS transistor 104 is connected to the node G_Source and the source thereof is grounded. That is, the MOS transistor 104 forms, together with the MOS transistor 102, a current mirror circuit. The gate width of the MOS transistor 104 will be called a gate width W2 below. The gate width W2 is narrower than the gate width W1 and the ratio thereof is, for example, W1:W2=10:1. That is, the current passed through the MOS transistor 104 is smaller than that passed through the MOS transistor 102 (the current passed through the source line SL) and the value thereof is (W2/W1) times and, for example, a value of 1/10.

The MOS transistor 105 has gate to which a signal P_GATE is input, the source connected to the source potential VDD, and the drain connected to the drain of the MOS transistor 104. The MOS transistor 105 supplies the reference current by the signal P_GATE being provided to the gate.

The inverter 106 inverts voltage levels at the connection node between the drain of the MOS transistor 104 and that of the MOS transistor 105.

The MOS transistor 107 has a gate to which an output of the inverter 106 is input, the source which is grounded, and the drain connected to the output node of the comparator 101. That is, when data whose read level is negative is read, the drain of the MOS transistor 107 is connected to the node G_Source.

<Reading Operation of Data>

Next, a reading operation of data in a NAND-type flash memory according to the present embodiment will be described below. The following description is the same for verification to be performed in a writing operation of data. That is, the writing operation is performed by repeating a program operation and verification operation of data. The program operation is an operation to inject electrons in the charge storage layer 84 by generating a potential difference between the control gate 86 of the memory cell transistor MT and a channel. The verification operation is an operation to verify whether the threshold voltage of the memory cell transistor MT is a desired value by reading data from the programmed memory cell transistor MT. <<Voltage Relations of Each Signal Line>>

Figure 5:
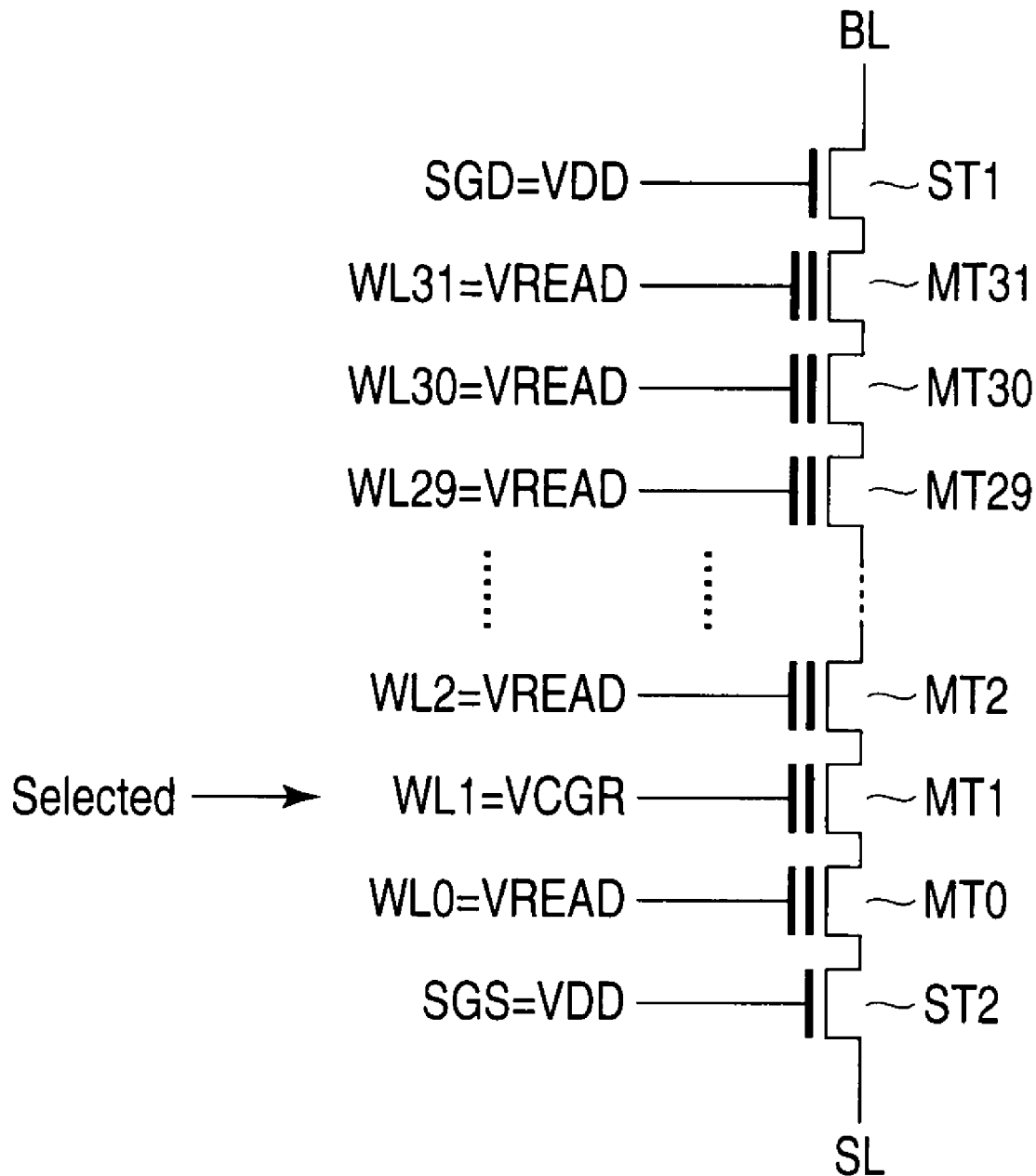
FIG. 5 is a circuit diagram of a memory cell unit according to the first embodiment.

Voltage relations of each signal line in a reading operation will be described using FIG. 5. FIG. 5 is a circuit diagram of the memory cell unit 11 when data is read. The following description takes a case in which a reading operation is performed from the memory cell transistor MT connected to the word line WL1 as an example.

First, the sense amplifier 20 (not shown) precharges the bit line BL via the current path of the MOS transistor 50.

The row decoder 30 selects the word line WL1 and applies a voltage VCGR to the selected word line WL1. Further, the row decoder 30 applies a voltage VREAD to the unselected word lines WL0, and WL2 to WL31. Further, the row decoder 30 applies the voltage VDD to the select gate lines SGD and SGS.

The voltage VREAD is a voltage to turn on the memory cell transistor MT regardless of the held data. The voltage VCGR is a voltage applied to the memory cell transistor to be read and changes in accordance with data to be read. The voltage VDD applied to the select gate lines SGD and SGS is a voltage capable of turning on the selection transistors ST1 and ST2.

As a result of the foregoing, the memory cell transistors MT connected to the unselected word lines WL0, and WL2 to WL31 are turned on to form a channel. The selection transistors ST1 and ST2 are also turned on.

If the memory cell transistor MT connected to the selected word line WL1 is turned on, the bit line BL and the source line SL are electrically connected. That is, a current is passed from the bit line BL to the source line SL. If, on the other hand, the memory cell transistor MT is off, the bit line BL and the source line SL are electrically non-connected. That is, no current is passed from the bit line BL to the source line SL.

<<Voltage Relations of Memory Cell Transistors>>

Next, voltage relations of the memory cell transistors MT will be described below, separately for a case in which data whose read level is equal to zero or more ("2" data to "7" data) is read and a case in which data whose read level is negative ("1" data) is read. As in FIG. 5, a case in which data is read from the memory cell transistor MT connected to the word line WL1 will be described below as an example.

(CASE I)

First, a case in which data whose read level is equal to zero or more is read will be described as CASE I using FIG. 6. FIG. 6 is a sectional view of a partial region of a memory cell unit.

As illustrated in FIG. 6, the voltage VDD is applied to the select gate line SGS and the voltage VREAD to the word line WL0. Therefore, a channel 93 is formed in the selection transistor ST2 and the memory cell transistor MT0. This also applies to the selection transistor ST1 and the memory cell transistors MT2 to MT31.

Then, the voltage VCGR is applied to the selected word line WL1. The voltage VCGR is a voltage equal to the read level. That is, when "2" data is read, the voltage V12 is applied, when "3" data is read, the voltage V23 is applied, and when "7" data is read, the voltage V67 is applied. If, for example, a memory cell transistor MT is off when the voltage V67 is applied to the selected word line WL, data held by the memory cell transistor MT is known to be "7" data. Moreover, 0V is provided to the source line SL by the MOS transistor 102 being turned on in the source line control circuit 60.

FIG. 6 shows, as an example, a case in which "5" data is read. The voltage V45 is applied as a gate-source voltage VGS in the memory cell transistor MT1 by the aforementioned applied voltage.

(CASE II)

Next, a case in which data whose read level is negative will be described as CASE II using FIG. 7. FIG. 7 is a sectional view of a partial region of a memory cell unit.

As illustrated in FIG. 7, the selection transistors ST1 and ST2 and the memory cell transistors MT0 and MT2 to MT31 are the same as those in CASE 1.

The voltage VCGR is applied to the selected word line WL1. If the read level is negative, the value of the voltage VCGR is a value obtained by subtracting the absolute value of the read level from the voltage VREF_SRC. That is, when "0" data is read, the voltage VCGR=V01'=(VREF_SRC−|V01|) and is preferably a value equal to zero or more. If, for example, the voltage VREF_SRC=|V01|, the voltage VCGR=V01'=0V. Moreover, in the source line control circuit 60, the potential of the source line SL becomes VREF_SRC by the node G_Source being connected to the output node of the comparator 101.

FIG. 7 shows how "1" data is read. In the memory cell transistor MT1, as described above, the voltage V01 is applied as the gate-source voltage VGS by VREF_SRC being applied to the source line SL and the voltage V01' being applied to the selected word line WL. If the memory cell transistor MT1 holds "1" data, the memory cell transistor MT1 is turned off and no cell current is passed. Conversely, if the memory cell transistor MT1 is turned on, it is known that data held by the transistor MT1 is "0". Therefore, according to the above reading method, reading of "1" data can be said at the same time to be reading of "0" data.

<<Sense Amplifier Operation>>

Next, the operation of the sense amplifier 20 in a reading operation will be described with reference to FIG. 8 to FIG. 11. FIG. 8 to FIG. 11 are circuit diagrams of the sense amplifier 20 and the MOS transistor 50 is also shown. In the description below, the memory cell transistor MT being turned on when data is read will be called "1" reading and the memory cell transistor MT being off will be called "0" reading. In a reading operation of data whose read level is zero or more, the signals S1 and S2 are set to be (Vt+0.9V) and (Vt+1.2V), respectively. Vt is the threshold voltage of the MOS transistors 144 and 146 respectively. The signal BLCLAMP is set to be (VTN+0.7V). VTN is the threshold voltage of the MOS transistor 50. When data whose read level is negative is read, the above voltage is further raised by the voltage VREF_SRC. The description below takes a case in which the read level is zero or more as an example, but a case in which the read level is negative is the same.

(CASE I)

First, CASE I will be described below as a case in which "1" is read.

Figure 8:
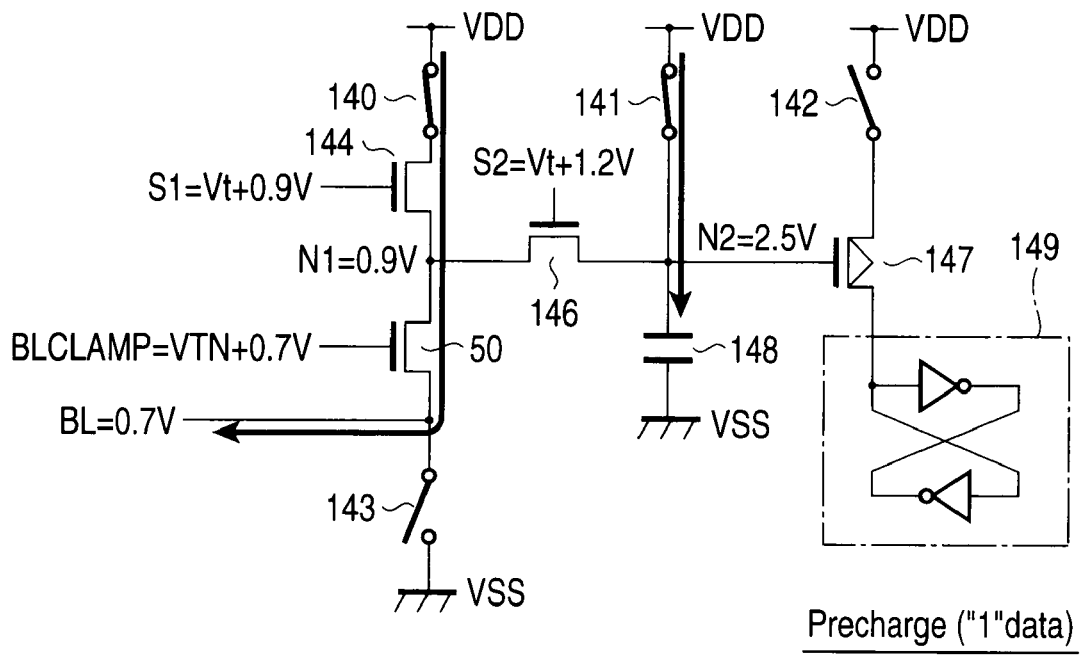
FIG. 8 to FIG. 11 are circuit diagrams of the sense amplifier according to the first embodiment.

As shown in FIG. 8, the bit line BL is precharged. As illustrated in FIG. 8, the switching device 140 is caused to switch on. Then, the memory cell unit is electrically connected and thus, a current is passed to the bit line BL via the switching device 140, the current path of the MOS transistor 144, the node N1, and the current path of a MOS transistor 50. As a result, the potential of the bit line BL will be about 0.7V. That is, the potential of the bit line BL is fixed to 0.7V while a current is passed from the bit line BL to the source line SL. In addition, the switching device 141 is turned on, a capacitative element is charged, and the potential of the node N2 becomes about 2.5V. The switching devices 142 and 143 are off.

Figure 9:
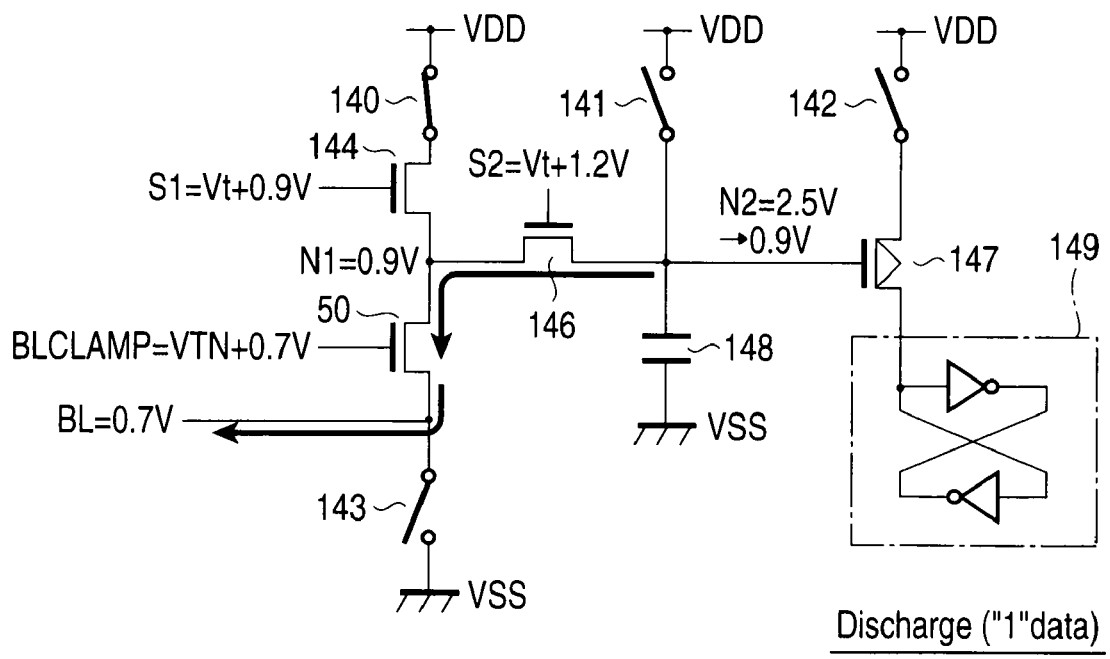

Next, as shown in FIG. 9, the node N2 is discharged. That is, the switching device 141 is turned off. Then, the node N2 is discharged by a current passed from the node N2 to the bit line BL and the potential thereof drops to about 0.9V.

Figure 10:
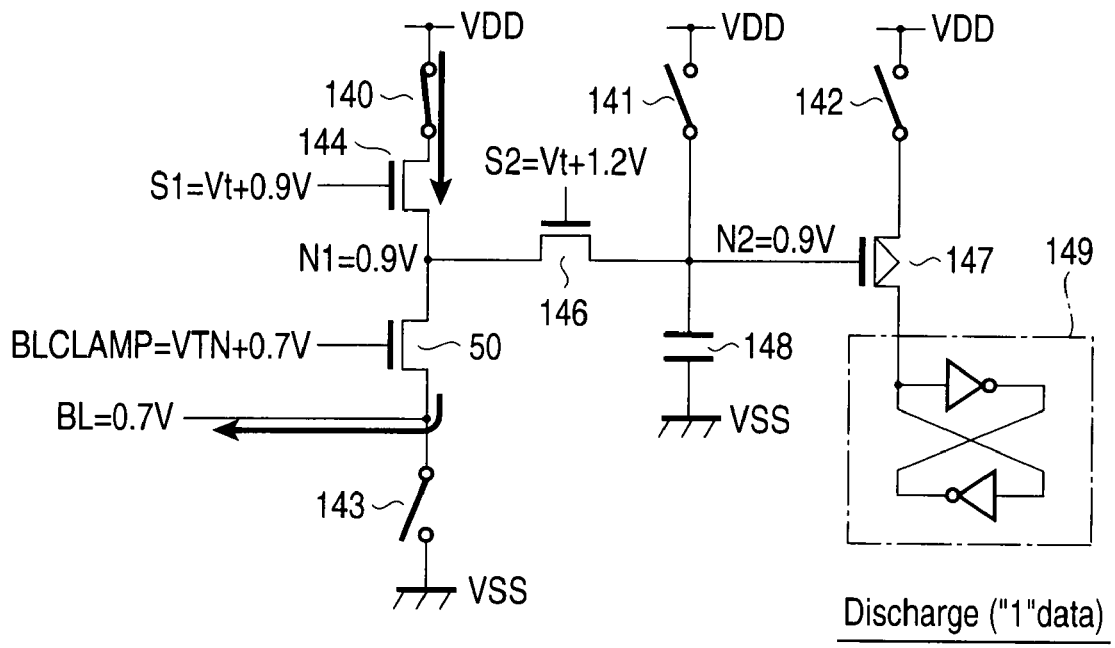

Subsequently, as shown in FIG. 10, the node N2 is discharged. As illustrated in FIG. 10, when the potential of the node N1 starts to drop below 0.9V, the MOS transistor 147 starts to supply a current. As a result, the potential of the node N1 is maintained at 0.9V.

Figure 11:
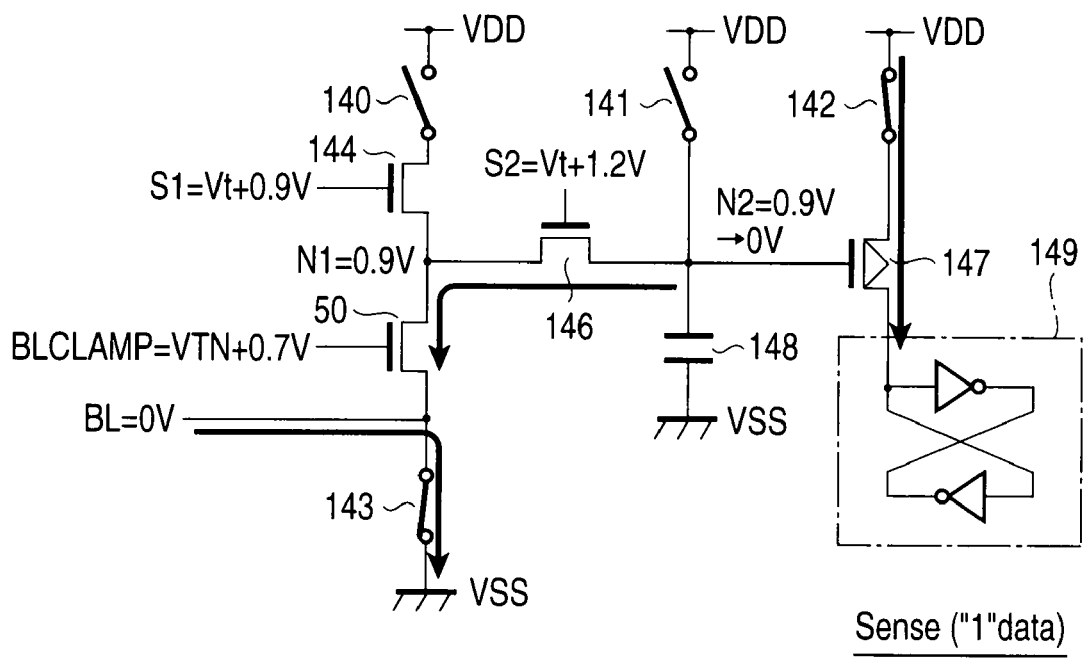

Next, as shown in FIG. 11, data is sensed. As illustrated in FIG. 11, the potential of the node N2 is 0.9V and thus, the MOS transistor 147 is turned on. Therefore, the latch circuit 149 retains the voltage VDD. With the latch circuit 149 retaining the voltage VDD, the switching device 140 is turned off and the switching device 143 is turned on. As a result, the potential of the node N2 becomes 0V. As a result, the latch circuit 149 continues to retain the voltage VDD. In addition, a current is passed from the bit line BL to a VSS node via the switching device 143 and the potential of the bit line BL becomes VSS (0V).

In the present embodiment, processing from precharging to sensing shown in FIG. 8 to FIG. 11 is performed a plurality of times, for example, two times when reading data of the lowest threshold voltage ("1" data), which is one level above an erased state. That is, in the first reading, data is read from memory cell transistors MT through which a cell current is easily passed and next, data is read from memory cell transistors MT less likely to allow a cell current to be passed through. This is intended to suppress an influence of noise (fluctuations) of the source line SL and in the second reading, data is read while turning off the memory cell transistors MT that have been turned on in the first reading.

(CASE II)

Next, CASE II will be described below as a case in which "0" is read.

In this case, no current is passed through the bit line BL and the potential thereof is constant at 0.7V. Then, the potential of the node N2 remains at about 2.5V. Therefore, the MOS transistor 147 is turned off and the latch circuit 149 retains the voltage VSS (0V). Accordingly, the switching device 140 is turned on, the switching device 143 is turned off, the potential of the node N2 remains at 2.5V, and the latch circuit 149 continues to retain the voltage VSS.

<<Operation of the Source Line Control Circuit>>

Figure 12:
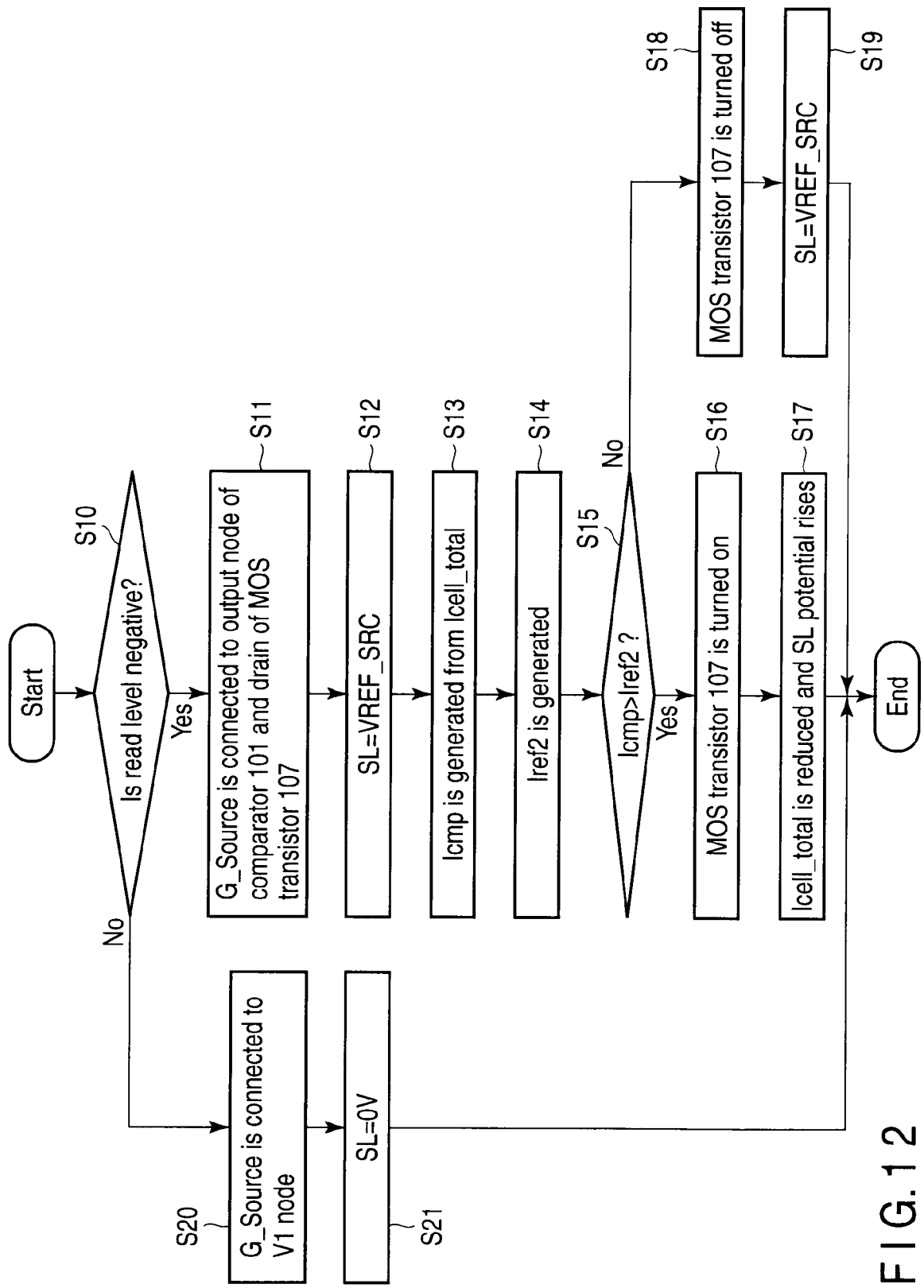
FIG. 12 is a flow chart showing an operation of a source line control circuit according to the first embodiment.

Next, the operation of the source line control circuit 60 in a reading operation will be described using FIG. 12 and FIG. 13. FIG. 12 is a flow chart showing an operation of the source line control circuit 60 in a reading operation and FIG. 13 is a circuit diagram of the memory cell array 10 and the source line control circuit 60 in a reading operation. FIG. 13 shows only principal parts of the source line control circuit 60.

First, if the read level is negative (step S10, YES), the switching device 108 connects the node G_Source to the connection node of the output node of the comparator 101 and the drain of the MOS transistor 107 following the selection signal SELECT (step S11). Accordingly, the potential of the source line SL is controlled by the voltage comparing unit 61 and the value thereof becomes VREF_SRC.

A cell current Icell flows into the source line SL from the bit line BL via each of the memory cell units 11 (see FIG. 13). The total of cell currents Icell will be called a current Icell_total below. The current Icell_total flows into the ground potential via the current path of the MOS transistor 102. Then, the comparator 101 controls the potential of the node G_Source so that the source line SL maintains the potential VREF_SRC.

In the current comparing unit 63, the MOS transistor 104 generates a current Icmp from the current Icell_total (step S13). As described above, the MOS transistor 104 forms a current mirror circuit together with the MOS transistor 102. Therefore, the current Icmp will be (W2/W1)×Icell_total. The current Icmp flows as a drain current of the MOS transistor 104 (see FIG. 13).

Further, the MOS transistor 105 generates a reference current Iref2 by the signal P_GATE being provided to the gate (step S14, see FIG. 13). That is, the reference current Iref2 flows as a drain current of the MOS transistor 105. The reference current Iref2 is set to be a value (W2/W1) times the upper limit of the current Icell_total passed through the source line SL. That is, if the current Icmp is equal to the reference current Iref2, the current Icell_total is equal to the upper limit permitted for the source line SL and if the current Icmp exceeds the reference current Iref2, the current Icell_total exceeds the upper limit.

When the current Icmp exceeds the reference current Iref2 (step S15, YES), the input node of the inverter 106 is at the "L" level and the output node at the "H" level. Therefore, the MOS transistor 107 is turned on (step S16). Consequently, the potential of the node G_Source drops. As a result, the driving force of the MOS transistor 102 drops. Thus, the current Icell_total decreases to become the upper limit permitted for the source line SL. The potential of the source line rises above VREF_SRC, reaching a value in line with the upper limit of the current Icell_total in the end (step S17).

If, on the other hand, the current Icmp does not exceed the reference current Iref2 (step S15, NO), or the current Icmp is equal to the reference current Iref2, the input node of the inverter is at the "H" level and the output node at the "L" level. Therefore, the MOS transistor 107 is turned off (step S18). Consequently, the potential of the node G_Source is controlled by output of the comparator 101. As a result, the source line SL maintains the potential VFRE_SRC (step S19).

If the read level is zero or a positive value at step S10 (step S10, NO), the switching device 108 connects the node G_Source to the voltage V1 node (step S20). Therefore, the MOS transistor 102 is turned on and the potential of the source line SL becomes 0V (step S21). In this case, the potential of the node G_Source is constant at V1, regardless of a comparison result of the current comparing unit 63.

<<Voltage Changes of Each Node in a Reading Operation>>

Figure 14:
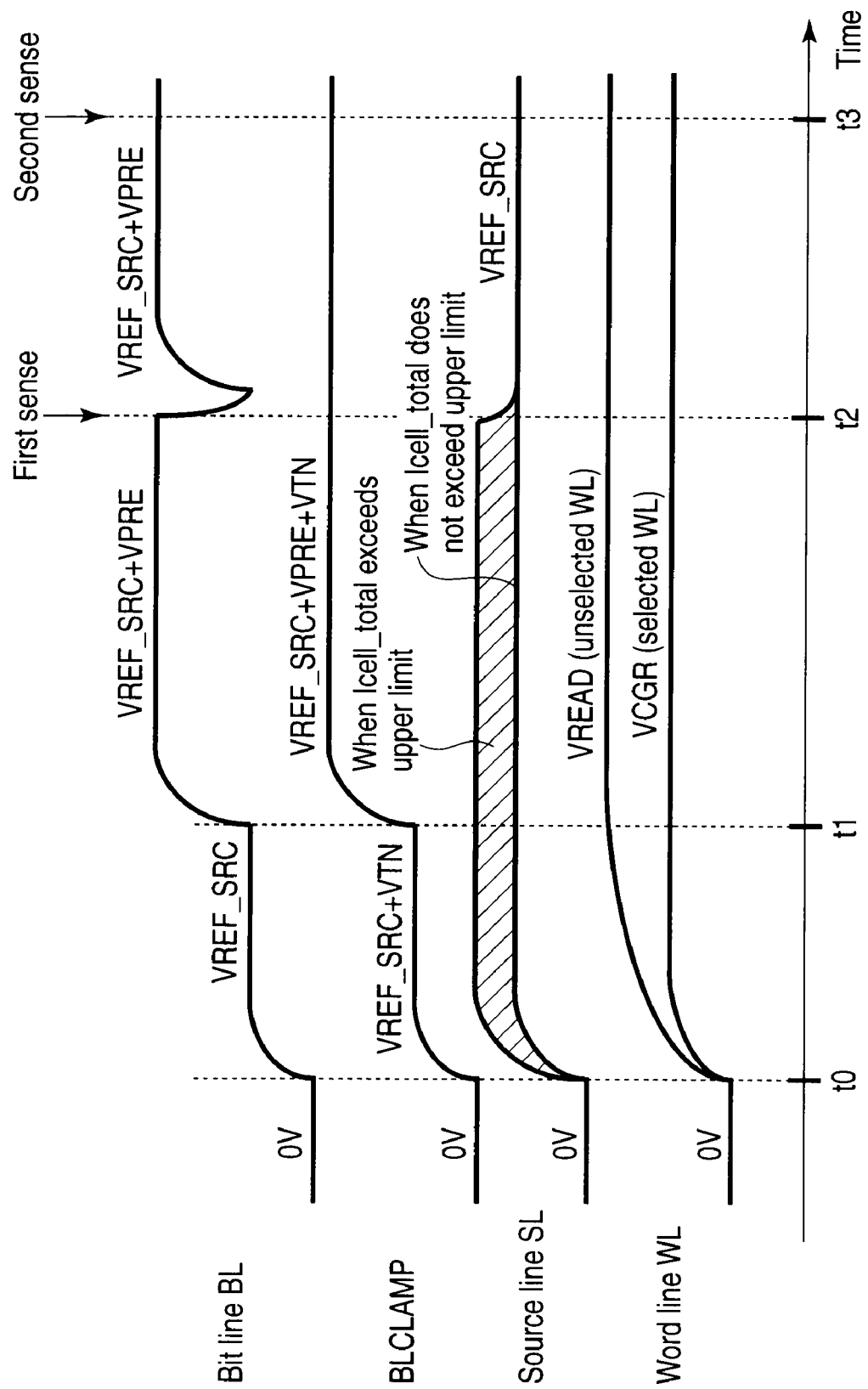
FIG. 14 is a timing chart of various voltages during reading operations of a flash memory according to the first embodiment.

Voltages of the bit line BL, signal BLCLAMP, source line SL, and word line WL in the reading operations described above will be described using FIG. 14. FIG. 14 is a timing chart showing voltage changes of various signals when data whose read level is negative ("1" data) is read.

As illustrated in FIG. 14, a read operation starts at time t0. The row decoder 30 applies the voltage VCGR (=V01') to the selected word line WL and the voltage VREAD to the unselected word lines WL at time t0.

The bit line driver 40 generates a voltage (VREF_SRC+VTN) as a signal BLCLAMP. The voltage VTN is the threshold voltage of the MOS transistor 50. As a result, the MOS transistor 50 is turned on. Therefore, the bit line BL and the sense amplifier 20 are electrically connected.

The sense amplifier 20 also sets the potential of the bit line BL at VREF_SRC.

Further, the source line control circuit 60 controls the potential of the source line SL. As described above, if the current flowing from the bit line BL to the source line SL does not exceed the upper limit, the potential of the source line SL is fixed to VREF_SRC and, if the current exceeds the upper limit, the potential of the source line SL becomes a value higher than VREF_SRC. The potential of the source line SL when exceeding the upper limit is shown as a diagonally shaded area in FIG. 14. Potentials of the signal BLCLAMP and the bit line BL are raised by VREF_SRC because the potential of the source line SL is raised by at least VREF_SRC above 0V.

Next, precharging is performed by the sense amplifier 20 at time t1. Thus, the potential of the signal BLCLAMP is set to (VREF_SRC+VPRE+VTN). The voltage VPRE is the precharge potential by the sense amplifier 20. The potential of the bit line BL is set to (VREF_SRC+VPRE). The operation of the sense amplifier 20 in this case is as described using FIG. 8 and VPRE=0.7V in the example of FIG. 8. Then, discharging described using FIG. 9 and FIG. 10 is performed and at time t2, data is sensed, as described using FIG. 11.

Subsequently, the same data ("1" data) is read. That is, the bit line is precharged and discharged again before the second sensing at time t3. During the second read, as described above, bit lines to which memory cell transistors MT turned on in the first read are connected are not discharged. FIG. 14 shows a case in which the potential of the source line SL in the second read is fixed to VREF_SRC. In the second read, according to this method, a comparison result of the current comparing unit 63 is made unreflected in the node G_Source by making the node G_Source unconnected to the drain of the MOS transistor 107. Naturally, the node G_Source may be controlled by the current comparing unit 63 also in the second read.

When data whose read level is zero or more is read, voltages are the same as described using FIG. 14, except that the potential of the source line SL is set at 0V and potentials of the bit line BL and the signal BLCLAMP are set to VPRE and (VPRE+VTN), respectively.

<Effect>

With a semiconductor memory device according to the first embodiment of the present invention, as described above, an effect of (1) described below is achieved.

(1) Reliability of semiconductor memory devices can be improved.

In a NAND-type flash memory according to the present embodiment, the source line control circuit 60 monitors the current Icell_total passed to the source line SL. The source line control circuit 60 executes control so that Icell_total does not exceed the upper limit. Therefore, reliability of the NAND-type flash memory can be improved. This effect will be described below.

Figure 15:
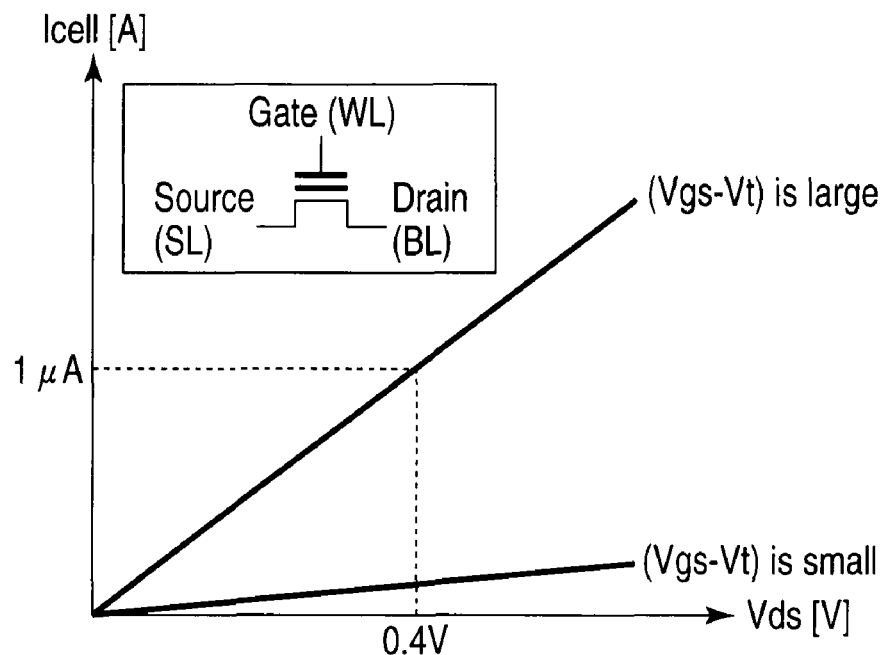
FIG. 15 is a graph showing a relationship between Vds and Icell.

FIG. 15 is a graph showing a relationship between a drain-source voltage Vds of the memory cell transistor MT and cell current (drain current) Icell. As illustrated in FIG. 15, the cell current Icell increases with an increasing difference between a gate-source voltage Vgs and the threshold voltage Vt of the memory cell transistor MT.

When data whose read level is zero or more is read, the potential of the source (source line SL) is normally set at 0V and the read level is provided to the gate (word line WL). In the present embodiment, when data whose read level is negative is read, the voltage VREF_SRC is applied to the source. Accordingly, even if the read level is negative, the gate voltage can be made a value equal to zero or more.

Regardless of which technique among techniques described above is used, the current Icell_total passed to the source line SL is not allowed to exceed the preset upper limit (current specs allowed for one chip). Exceeding the upper limit could lead to degraded reliability of the NAND-type flash memory. Particularly for the technique to read data whose read level is negative, the voltages Vds and Vgs could become too big if no measures against an increasing cell current Icell are taken. This is because the voltage VREF_SRC is supplied to the source line and the potential thereof is fixed to VREF_SRC. In addition, the value of the current Icell_total passed to the source line SL could exceed specs (upper limit) specified for the NAND-type flash memory depending on a data pattern in a page to be read.

Figure 16:
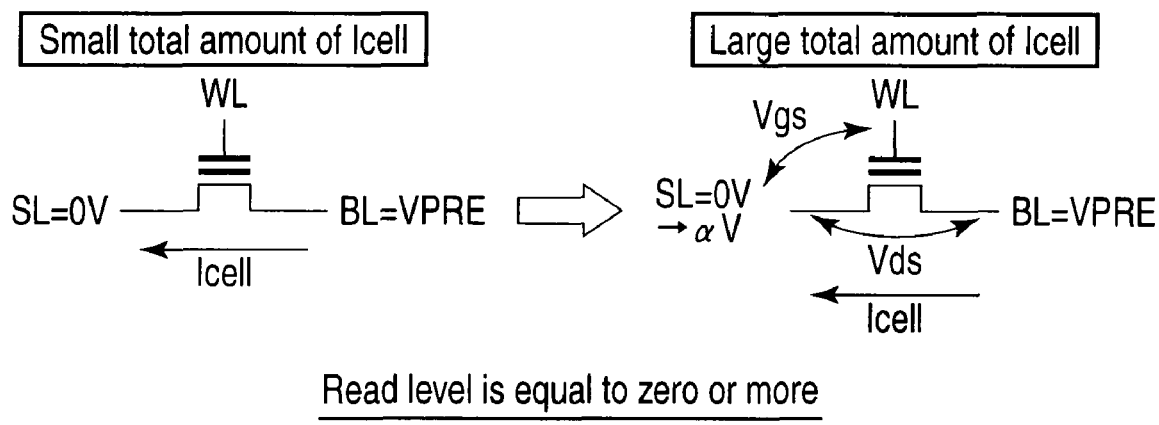
FIG. 16 and FIG. 17 are circuit diagrams of a memory cell according to the first embodiment and diagrams showing voltages and the like when the memory cell is read.
Figure 17:
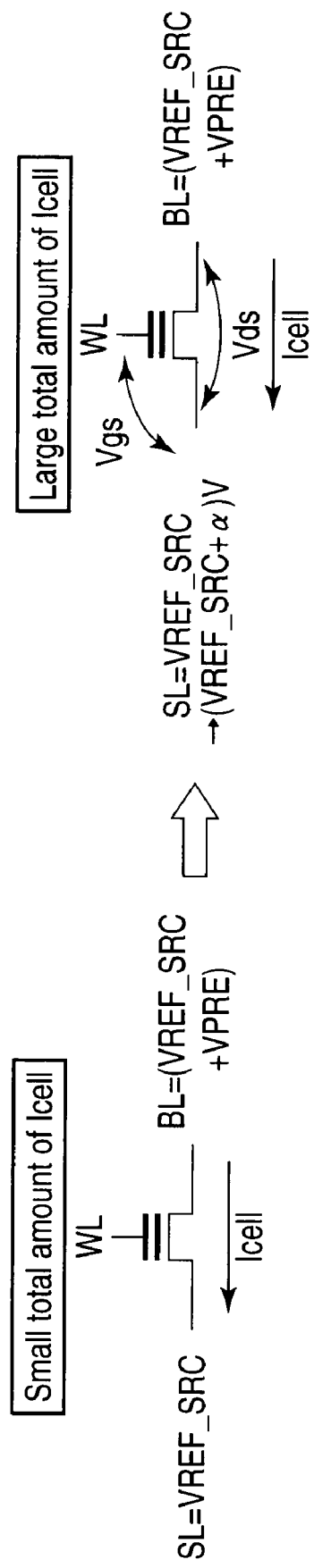

However, according to the present embodiment, an excessive increase of the current Icell_total of the source line SL can be suppressed to improve reliability of the NAND-type flash memory by any of the above methods. This point will be described using FIG. 16 and FIG. 17. FIG. 16 and FIG. 17 are circuit diagrams showing voltage relations of the memory cell transistor MT when the read level is equal to zero or more and negative respectively.

First, a case in which the read level is equal to zero or more will be described with reference to FIG. 16. As illustrated in FIG. 16, the potential of the bit line BL is the precharge potential VPRE and that of the source line SL is 0V. If the current Icell_total is small, the gate-source voltage Vgs is approximately equal to the read level. If, on the other hand, the current Icell_total increases, the potential of the source line SL also rises. That is, the potential of the source line SL rises from 0V to α V in accordance with the current Icell_total. Therefore, compared with a case in which the current Icell_total is small, Vgs and Vds cannot be secured adequately. As a result, an increase of the current Icell_total is suppressed so that the current Icell_total can be prevented from exceeding the upper limit.

Next, a case in which the read level is negative will be described with reference to FIG. 17. As illustrated in FIG. 17, the potential of the bit line BL is (VREF_SRC+VPRE) and that of the source line SL is VREF_SRC. If the current Icell_total is small, the gate-source voltage Vgs is approximately equal to the read level. If, on the other hand, the current Icell_total increases, the potential of the node G_Source drops due to feedback control by the current comparing unit 63. As a result, the potential of the source line SL rises. That is, the potential of the source line SL rises from (VREF_SRC) to $\alpha$ V in accordance with the current Icell_total. Therefore, like the case in FIG. 16, compared with a case in which the current Icell_total is small, Vgs and Vds cannot be secured adequately. As a result, an increase of the current Icell_total is suppressed so that the current Icell_total can be prevented from exceeding the upper limit.

Figure 18:
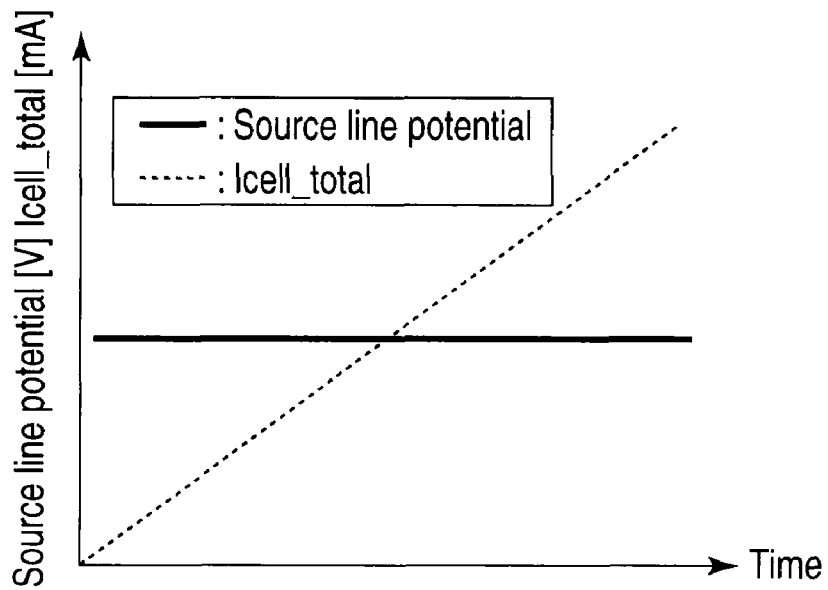
FIG. 18 is a graph showing a relationship between a potential of a source line and a total of cell currents.
Figure 19:
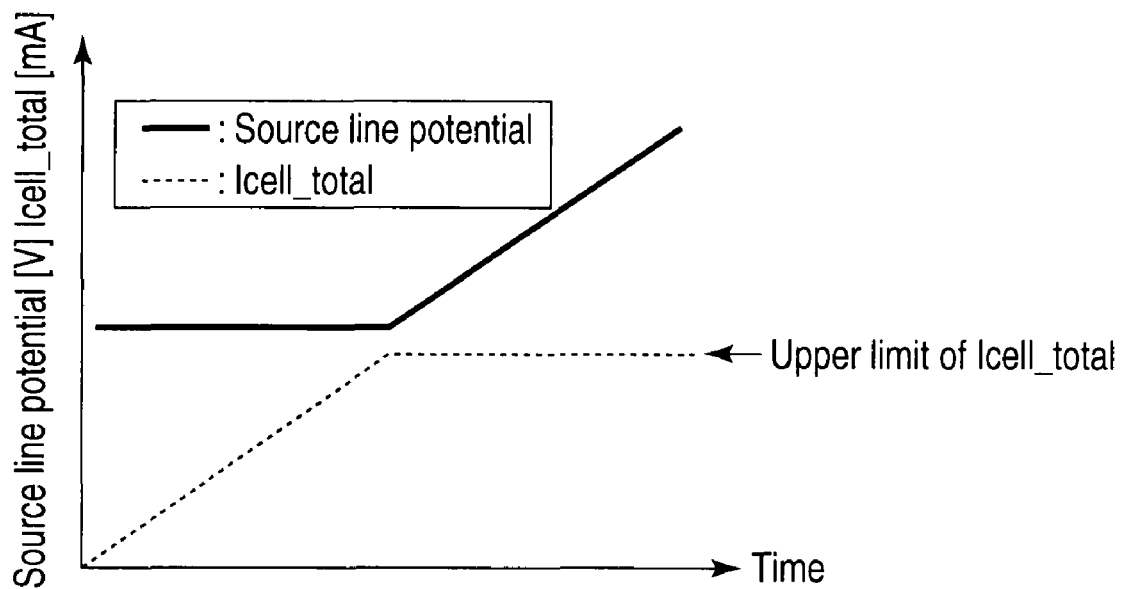
FIG. 19 is a graph showing the relationship between the potential of the source line and the total of cell currents in the flash memory according to the first embodiment.

Changes of the potential of the source line SL and the current Icell_total when data whose read level is negative is read will be described using FIG. 18 and FIG. 19. FIG. 18 and FIG. 19 are graphs showing changes of the potential of the source line SL and the current Icell_total. FIG. 18 is a graph showing the potential of the source line SL with the increasing current Icell_total when the potential of the node G_Source is controlled by the comparator 101 alone, and FIG. 19 is a graph under the same conditions as those in FIG. 18 when the potential of the node G_Source is controlled by the comparator 101 and the current comparing unit 63 (present embodiment).

When, as shown in FIG. 18, no control is executed by the current comparing unit 63, the potential of the source line SL is fixed to VREF_SRC by the voltage comparing unit 61, regardless of the current Icell_total. That is, the current Icell_total is not controlled at all and the current Icell_total may exceed the upper limit depending on read data.

However, in the present embodiment, as shown in FIG. 19, the potential of the node G_Source is lowered when the upper limit of the current Icell_total is reached and thus, a further increase of the current Icell_total is suppressed. Accordingly, the potential of the source line SL starts to rise when the current Icell_total is suppressed.

With the configuration according to the above embodiment, as described above, the current comparing unit 63 of the source line control circuit 60 monitors the current passed to the source line SL. Then, when the current passed to the source line SL reaches the upper limit thereof, the current control unit 62 is controlled so that the current does not increase further. Therefore, the current passed to the source line SL can be prevented from exceeding the upper limit.

Second Embodiment

Next, a semiconductor memory device according to a second embodiment will be described. The present embodiment is obtained by raising the potential of the source line SL during the first read of data of the lowest threshold voltage, which is one level above an erased state in the first embodiment, regardless of the magnitude of the current Icell_total. Only differences from the first embodiment will be described below.

FIG. 20 is a block diagram of the NAND-type flash memory according to the present embodiment. The configuration of the NAND-type flash memory 1 according to the present embodiment is obtained by modifying the configuration of the source line control circuit 60 in the configuration in FIG. 1 described in the first embodiment. The other configuration is the same as that in the first embodiment and a description thereof is omitted.

<Configuration of the Source Line Control Circuit 60>

The source line control circuit 60 in the present embodiment is obtained by making modifications below of the configuration in FIG. 1 described in the first embodiment.

That is, first, the current comparing unit 63 is eliminated from the source line control circuit 60.

Further, a switching device 109 is provided in the voltage comparing unit 61. The switching device 109 is controlled, for example, by a selection signal SELECT2 provided by the above control circuit. The switching device 109 connects the inversion input terminal of the comparator 101 to the voltage VREF_SRC2 when data whose read level is negative and the lowest is read in the first read. In the second and subsequent read of the data, the switching device 109 connects the inversion input terminal of the comparator 101 to the voltage VREF_SRC1. The voltage VREF_SRC1 is a voltage similar to the voltage VREF_SRC described in the first embodiment. The voltage VREF_SRC2 is a voltage higher than the voltage VREF_SRC1 and has a value corresponding, for example, to (VREF_SRC+$\alpha$) described with reference to FIG. 17.

The switching device 108 in the current control unit 62 is controlled by a selection signal SELECT1. The selection signal SELECT1 is the same as the selection signal SELECT described in the first embodiment. If the read level is negative, the switching device 108 connects the node G_Source to the output node of the comparator 101 and, if the read level is equal to zero or more, the switching device 108 connects the node G_Source to the voltage V1 node.

The other configuration is the same as that in the first embodiment.

<Operation of the Source Line Control Circuit 60>

Next, the operation of the source line control circuit 60 when the read level is negative will be described using FIG. 21. FIG. 21 is a flow chart showing the operation of the source line control circuit 60 and corresponds to processing at step S11 and thereafter in FIG. 12 in the first embodiment.

As illustrated in FIG. 21, if the read level is the lowest (that is, data of the lowest threshold voltage one level above an erased state and, further in other words, "1" data, step S30, YES) and the read is the first time (step S31, YES), the switching device 109 selects the voltage VREF_SRC2 (step S32). Therefore, the potential of the source line SL is constant at VREF_SRC2 (step S33).

If, in the subsequent read, the read level is negative (in the example in FIG. 3, in the second read of "1" data, step S30, NO or step S31, NO), the switching device 109 selects the voltage VREF_SRC1 (step S34). As a result, the potential of the source line SL is constant at VREF_SRC1 (step S35).

If the read level is equal to zero or more (in the example in FIG. 3, "1" data to "7" data), the potential of the source line SL is set to 0V.

Figure 22:
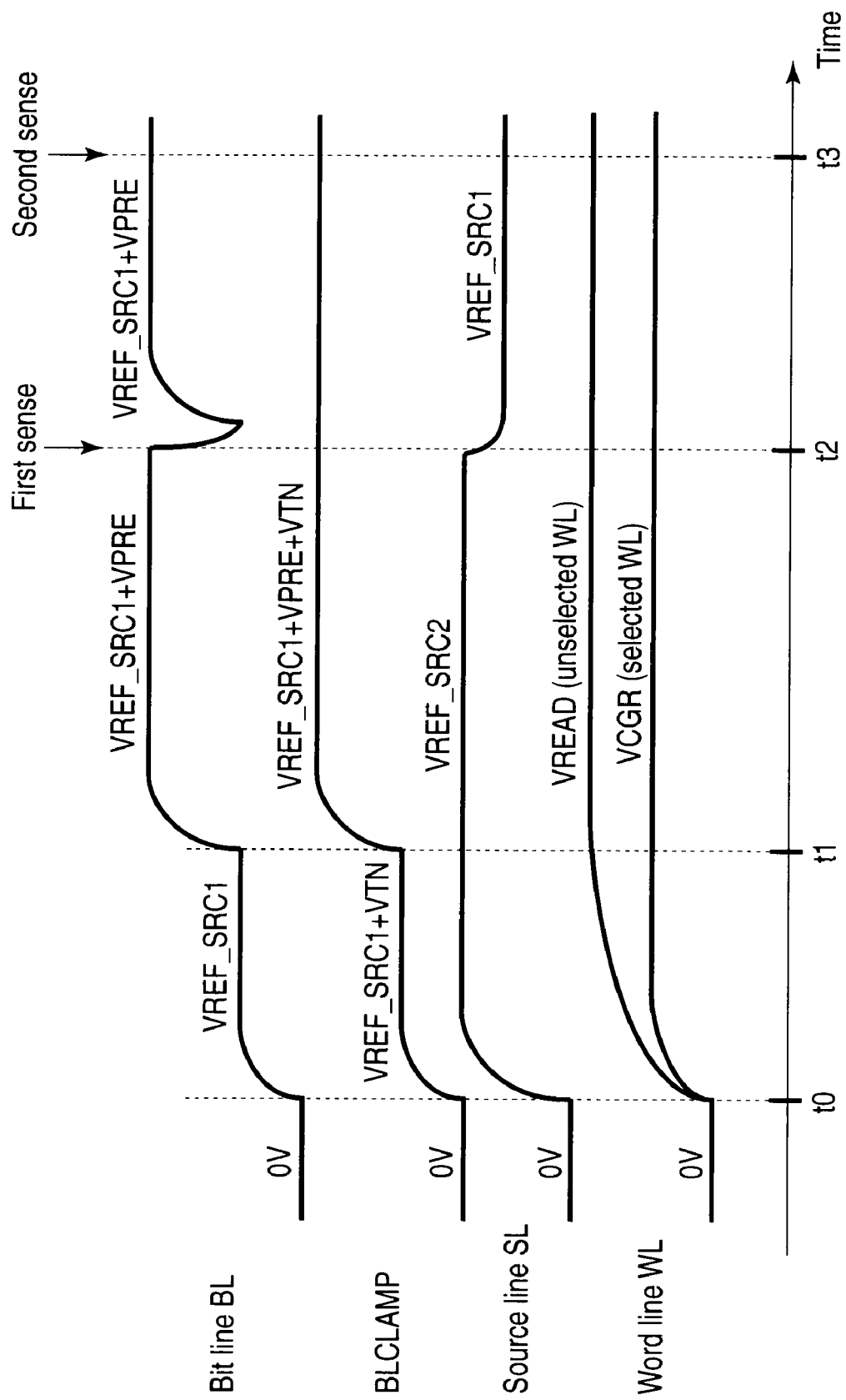
FIG. 22 is a timing chart of various voltages during reading operations of the flash memory according to the second embodiment.

FIG. 22 is a timing chart showing voltage changes of various signals when data whose read level is negative ("0" data) is read and shows voltages of the bit line BL, signal BLCLAMP, source line SL, and word line WL.

As illustrated in FIG. 22, voltage changes of the bit line BL, signal BLCLAMP, and word line WL are similar to those in FIG. 14 described in the first embodiment. A difference from the first embodiment is in that the potential of the source line SL is fixed to VREF_SRC2 in the first read of "1" data. That is, the potential of the source line SL is fixed to the value (VREF_SRC2) higher than the potential (VREF_SRC1) in the subsequent read, regardless of the magnitude of the current Icell_total passed to the source line SL.

<Effect>

With a semiconductor memory device according to the second embodiment of the present invention, as described above, an effect of (2) described below is achieved.

(2) The effect of (1) described above is achieved with a simple circuit configuration.

Normally, a read operation that requires the largest current Icell_total of cell current is the first read of data of the lowest threshold voltage one level above an erased state, that is, the first read of "1" data. In this case, the likelihood that Icell_total exceeds the upper limit is the highest because a current of cell in an erased state flows. In contrast, the value of Icell_total is relatively small in the second read of data corresponding to the level and the read of data having a higher threshold voltage than the level performed subsequent to the read of the level.

Thus, in the present embodiment, the potential (VREF_SRC2) of the source line SL during the first read of "1" data is made higher than the potential (VREF_SRC1) of the source line SL in the subsequent read, regardless of the value of the total cell current Icell_total. Therefore, the gate-source voltage Vgs of memory cell transistors is suppressed during the first read of "1" data and thus, Icell_total can be prevented from exceeding the upper limit thereof. In the subsequent read, the value of Icell_total is relatively small and Icell_total can practically be said not to exceed the upper limit thereof even if the potential of the source line SL is set at VREF_SRC1. Therefore, the same effect as (1) described in the first embodiment can be achieved.

Moreover, there is no need to monitor the current Icell_total in the present embodiment and potential control of the node G_Source in accordance with Icell_total is unnecessary. Therefore, the above effect can be achieved while the configuration of the source line control circuit 60 is simplified.

In the foregoing, it is assumed that the first read target data in a read sequence starts with "1" data. Therefore, if the first read target data is "4" data, the total of cell current is the largest during the first read of "4" data. That is, the cell current is the largest during the first read of the first read target data in a reading operation of data. This also applies herein in a description that follows. Therefore, in such a case, the potential of the source line SL may be set at VREF_SRC2.

Third Embodiment

Next, a semiconductor memory device according to a third embodiment will be described. The present embodiment is obtained by applying the voltage VREF_SRC to the source line SL also when data whose read level is equal to zero or more is read in the first embodiment. Only differences from the first embodiment will be described below.

FIG. 23 is a block diagram of the source line control circuit 60 according to the present embodiment. As illustrated in FIG. 23, the source line control circuit 60 according to the present embodiment has a configuration obtained by eliminating the switching device 108 from the configuration in FIG. 1 described in the first embodiment. In addition, the node G_Source is always connected to the connection node of the output node of the comparator 101 and the drain of the MOS transistor 107.

When data whose read level is equal to zero or more is read, the row decoder 30 applies a voltage higher than the read level by VREF_SRC to the selected word line WL. For example, when "2" data is read, (VREF_SRC+V12) is applied to the selected word line WL and when "3" data is read, (VREF_SRC+V23) is applied to the selected word line WL. This also applies hereinafter in the same manner.

FIG. 24 is a timing chart showing voltage changes of the source line SL and selected word line WL when data is read in a NAND-type flash memory according to the present embodiment.

As illustrated in FIG. 24, the potential of the source line SL is controlled by the current comparing unit 63 in the first read of "1" data. Then, subsequently, the potential is fixed to VREF_SRC, regardless of read data. Then, the voltage VCGR applied to the word line WL is raised in accordance with read data sequentially from "1" data.

<Effect>

With the semiconductor memory device according to the third embodiment of the present invention, as described above, an effect of (3) described below is achieved, in addition to the effect in (1).

(3) The reading operation can be made faster.

With the configuration according to the present embodiment, the potential of the source line SL is constant at VREF_SRC in the second read of "1" data and thereafter. That is, there is no need to change the potential of the source line in accordance with the read level. Therefore, the reading operation can be made faster and also, there is no need to provide the switching device 108 described in FIG. 1 and thus, the circuit configuration can be made simpler.

Timing to control the potential of the source line by the current comparing unit 63 in the above embodiment may be during the first read of the first read target data in a reading operation. Therefore, if the first read target data is "4" data, the potential of the source line is controlled by the current comparing unit 63 during the first read of the data.

Fourth Embodiment

Next, a semiconductor memory device according to a fourth embodiment will be described. The present embodiment is obtained by applying the third embodiment to the second embodiment. That is, the voltage VREF_SRC is applied to the source line SL also when data whose read level is equal to zero or more is read in the second embodiment. Only differences from the second embodiment will be described below.

Figure 25:
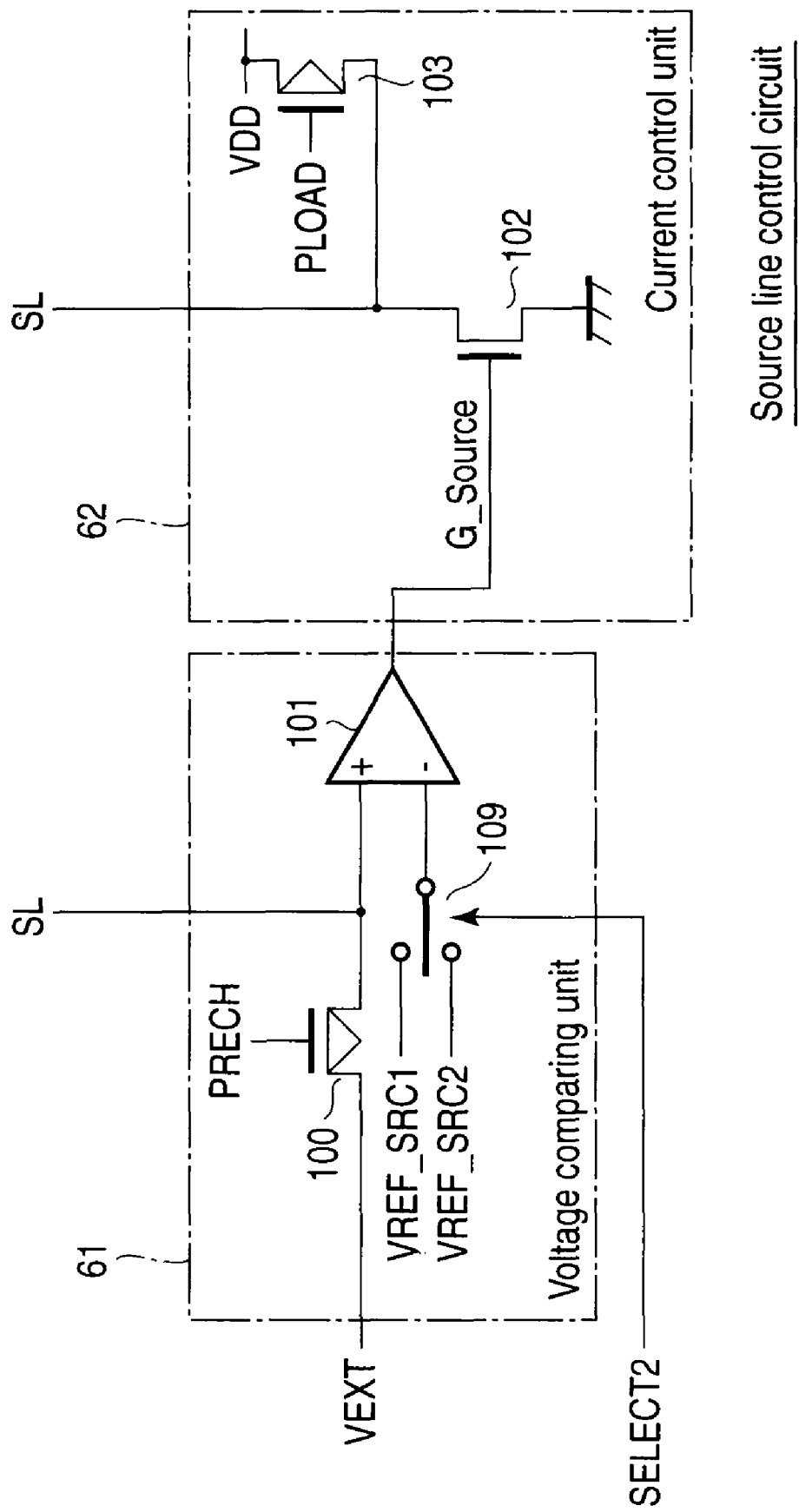
FIG. 25 is a circuit diagram of a source line control circuit according to a fourth embodiment.

FIG. 25 is a block diagram of the source line control circuit 60 according to the present embodiment. As illustrated in FIG. 25, the source line control circuit 60 according to the present embodiment has a configuration obtained by eliminating the switching device 108 from the configuration in FIG. 20 described in the second embodiment. In addition, the node G_Source is always connected to the output node of the comparator 101.

When data whose read level is equal to zero or more is read, the row decoder 30 applies a voltage higher than the read level by VREF_SRC1 to the selected word line WL. For example, when "2" data is read, (VREF_SRC1+V12) is applied to the selected word line WL and when "3" data is read, (VREF_SRC1+V23) is applied to the selected word line WL. This also applies hereinafter in the same manner.

Figure 26:
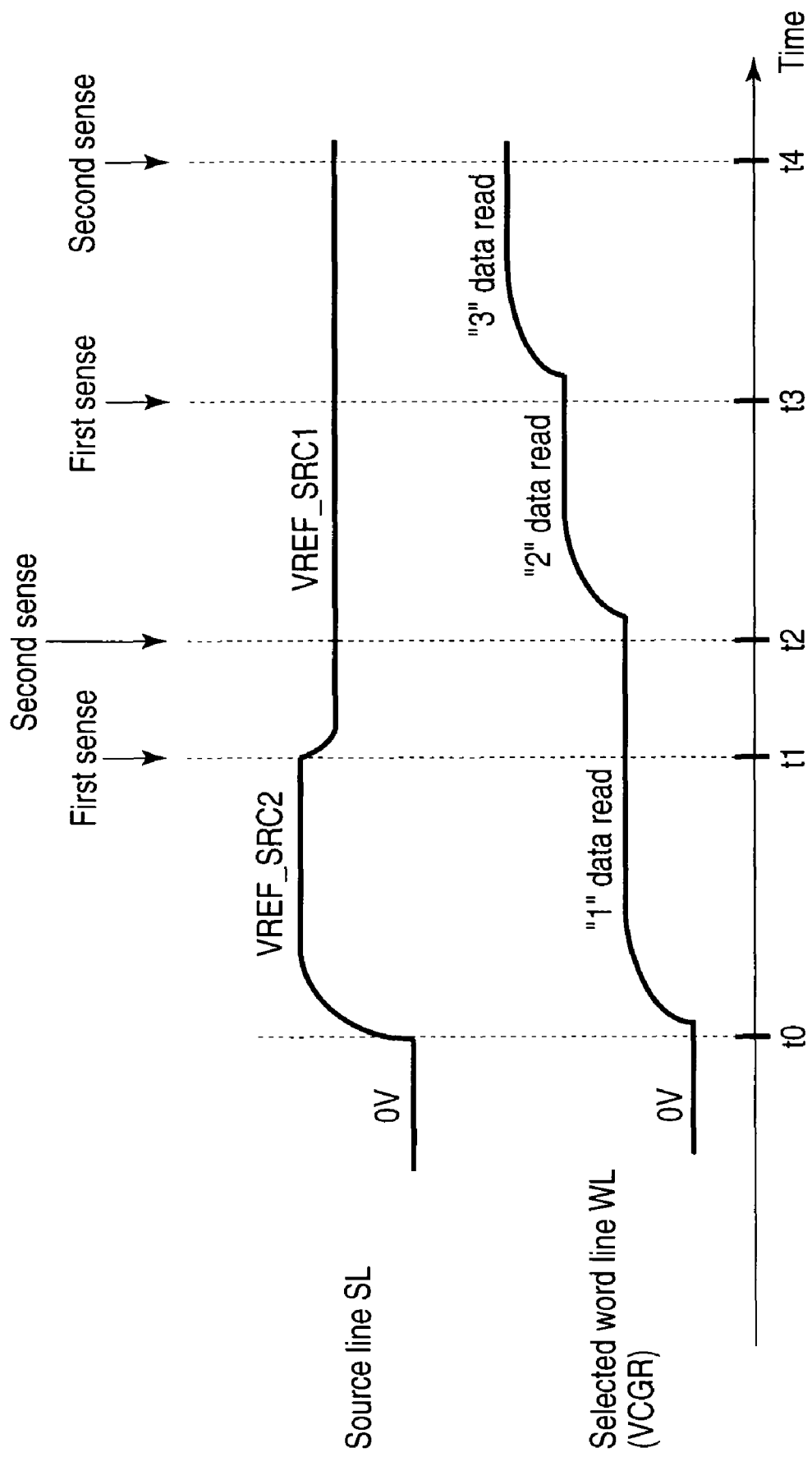
FIG. 26 is a timing chart of various voltages during reading operations of a flash memory according to the fourth embodiment.

FIG. 26 is a timing chart showing voltage changes of the source line SL and the selected word line WL when data is read in a NAND-type flash memory according to the present embodiment.

As illustrated in FIG. 26, the potential of the source line SL is fixed to VREF_SRC2 by the voltage comparing unit 61 in the first read of "1" data. Then, subsequently, the potential is fixed to VREF_SRC1 (<VREF_SRC2), regardless of read data. Then, the voltage VCGR applied to the word line WL is raised in accordance with read data sequentially from "0" data.

With the semiconductor memory device according to the fourth embodiment of the present invention, as described above, the effect of (3) described in the third embodiment is achieved, in addition to the effect in (2) described in the second embodiment. Also in the present embodiment, timing to set the potential of the source line at VREF_SRC2 may be during the first read of the first read target data in a reading operation.

With the semiconductor memory device according to any of the first to fourth embodiments, as described above, the positive voltage VREF_SRC is applied to the source line SL when data whose read level is negative is read. Then, if the current amount exceeds a predetermined upper threshold, the current driving force of a MOS transistor which passes the current to the ground potential is reduced. Accordingly, the potential of the source line SL is raised and Vgs of the memory cell transistor MT is lowered so that the current amount passed to the source line SL is prevented from exceeding the upper threshold.

For this purpose, the current amount passed to the source line SL is monitored in the first and third embodiments. If the monitored current amount reaches the upper threshold, the current driving force of the MOS transistor is reduced. In the second and fourth embodiments, in view of the fact that the total of cell current is the largest during the first read of data, the potential of the source line in this case is made higher than that during subsequent read.

According to the foregoing, the total of current passed to the source line SL can be prevented from exceeding current specs allowed for each chip to improve reliability of the semiconductor memory device.

In the first and third embodiments, the current of the source line may be controlled by the current comparing unit 63 only during the first data read. That is, when a plurality of pieces of data whose read level is negative exist, the potential of the source line may be fixed to VREF_SRC for data whose read level is higher than the first read level. This is because a cell current in an erased state flows, as described above, and thus, the first read among a series of reading operations is a reading operation with the largest current Icell_total. This applies also to the second and third embodiments.

In the first to fourth embodiments, all pieces of data ranging from "1" data to "7" data may be read two times. However, the first data read is normally sufficient. This is because source line noise is the largest during read of data in which a cell current of cells in an erased state flows.

Further, the first and third embodiments have been described by taking a case in which the gate width W2 of the MOS transistor 104 is smaller than the gate width W1 of the MOS transistor 102 as an example. Accordingly, a current passed to the MOS transistors 104 and 105 can be made smaller and current consumption by the current comparing unit 63 can be reduced. However, if current consumption presents no problem, W1 may be equal to W2.

Further, while the above embodiments have been described by taking a case in which there is only one piece of data ("1" data) whose read level is negative excluding an erased state ("0" data) as an example, there may be two or more pieces of such data. Further, while the above embodiments have been described by taking a NAND-type flash memory as an example, the present embodiments can be applied, for example, to a NOR-type flash memory and generally, to semiconductor memory devices in which a problem of rising source line potentials arises due to an increased cell current.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device, comprising:
   a memory cell including a charge storage layer and a control gate and capable of holding 2 or more levels of data;
   a source line electrically connected to a source of the memory cell; and
   a source line control circuit which detects a current passed to the source line and controls a potential of the source line in accordance with a detected current amount in a reading operation or a verification operation of data,
   wherein the source line control circuit increases the potential of the source line to limit the current passed to the source line when an amount of the current exceeds a predetermined fixed value.

2. The device according to claim 1, wherein the source line control circuit comprises:
   a first transistor which passes the current to the source line; and
   a second transistor which forms a current mirror circuit together with the first transistor and has a gate width smaller than that of the first transistor, wherein a gate potential of the first transistor is controlled in accordance with a comparison result of a current passed to the second transistor and a predetermined current threshold.

3. The device according to claim 1, further comprising:
   a sense amplifier which senses/amplifies the data read from the memory cell in the reading operation or the verification operation,
   wherein the sense amplifier reads the same data a plurality of times in the reading operation or the verification operation, and
   the source line control circuit controls the potential of the source line only in a first read of the plurality of times of read.

4. The device according to claim 1, wherein
   the source line control circuit applies a positive potential to the source line in accordance with data to be read or data to be verified.

5. The device according to claim 4, wherein,
   when the potential of the source line is higher than that of the control gate of the memory cell, the source line control circuit controls the potential of the source line in accordance with the current amount passed to the source line.

6. The device according to claim 4, wherein,
   when the potential of the source line is lower than that of the control gate, the source line control circuit maintains the potential of the source line constant.

7. The device according to claim 1, wherein
   the source line control circuit applies a positive potential to the source line regardless of data to be read or data to be verified.

8. The device according to claim 7, wherein,
   when the potential of the source line is higher than that of the control gate of the memory cell, the source line control circuit controls the potential of the source line in accordance with the current amount passed to the source line.

9. The device according to claim 7, wherein
when the potential of the source line is lower than that of the control gate of the memory cell, the source line control circuit maintains the potential of the source line constant.

10. The device according to claim 3, further comprising:
a bit line electrically connected to a drain of the memory cell,
wherein the sense amplifier determines data by sensing the current passed to the bit line.

11. A semiconductor memory device comprising:
a memory cell including a charge storage layer and a control gate and capable of holding 2 or more levels of data;
a source line electrically connected to a source of the memory cell;
a bit line electrically connected to a drain of the memory cell;
a sense amplifier which senses/amplifies data read from the memory cell in a reading operation or a verification operation of the data, the sense amplifier reading the same data a plurality of times in the reading operation or the verification operation, the sense amplifier determining the data by sensing a current passed to the bit line; and
a source line control circuit which controls a potential of the source line in the reading operation or the verification operation, the source line control circuit making the potential of the source line in a first read of the plurality of times of read in the reading operation higher than that for a subsequent read in the reading operation, a potential difference between the bit line and the source line in the first read being smaller than that in the subsequent read.

12. The device according to claim 11, wherein
the source line control circuit applies a positive potential to the source line in accordance with data to be read or data to be verified.

13. The device according to claim 12, wherein,
when the potential of the source line is higher than that of the control gate of the memory cell, the source line control circuit makes the potential of the source line in the first read higher than that for the subsequent read.

14. The device according to claim 12, wherein,
when the potential of the source line is lower than that of the control gate of the memory cell, the source line control circuit maintains the potential of the source line constant.

15. The device according to claim 11, wherein
the source line control circuit applies a positive potential to the source line regardless of data to be read or data to be verified.

16. The device according to claim 15, wherein,
when the potential of the source line is higher than that of the control gate of the memory cell, the source line control circuit makes the potential of the source line in the first read higher than that for the subsequent read.

17. The device according to claim 15, wherein
when the potential of the source line is lower than that of the control gate of the memory cell, the source line control circuit maintains the potential of the source line constant.

* * * * *